(12) United States Patent
Su et al.

(10) Patent No.: US 12,159,879 B2
(45) Date of Patent: Dec. 3, 2024

(54) DISPLAY PANEL AND DISPLAY DEVICE

(71) Applicants: Beijing BOE Display Technology Co., Ltd., Beijing (CN); BOE Technology Group Co., Ltd., Beijing (CN)

(72) Inventors: Qiujie Su, Beijing (CN); Lingdan Bo, Beijing (CN); Dongchuan Chen, Beijing (CN); Jiantao Liu, Beijing (CN); Jianbo Xian, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/912,255

(22) PCT Filed: Dec. 31, 2021

(86) PCT No.: PCT/CN2021/143492
§ 371 (c)(1),
(2) Date: Sep. 16, 2022

(87) PCT Pub. No.: WO2023/123304
PCT Pub. Date: Jul. 6, 2023

(65) Prior Publication Data
US 2024/0213262 A1 Jun. 27, 2024

(51) Int. Cl.
*H01L 27/12* (2006.01)
*G09G 3/20* (2006.01)
*G11C 19/28* (2006.01)

(52) U.S. Cl.
CPC ............. *H01L 27/124* (2013.01); *G09G 3/20* (2013.01); *G11C 19/287* (2013.01); *G09G 2310/0286* (2013.01)

(58) Field of Classification Search
CPC ................... H01L 27/124; G09G 3/20; G09G 2310/0286; G11C 19/287
See application file for complete search history.

(56) References Cited

U.S. PATENT DOCUMENTS

2016/0293270 A1* 10/2016 Jin .................... G11C 19/287
2019/0006018 A1   1/2019 Fang et al.
(Continued)

FOREIGN PATENT DOCUMENTS

CN    103943085 A    7/2014
CN    104700813 A    6/2015
(Continued)

OTHER PUBLICATIONS

EP counterpart application 21969661.4 EESR issued on May 15, 2024.

*Primary Examiner* — Premal R Patel
(74) *Attorney, Agent, or Firm* — ArentFox Schiff LLP; Michael Fainberg

(57) ABSTRACT

Embodiments of the present disclosure provide a display panel and a display device. The display panel includes: a base substrate including a non-display area; a gate drive circuit located in the non-display area, where the gate drive circuit includes a plurality of shift registers, and the plurality of shift registers are divided into a plurality of register sets; and a plurality of signal lead-in lines located in the non-display area, where the plurality of signal lead-in lines are divided into a plurality of line sets, a frame start signal end of one register set is correspondingly and electrically connected to one line set, and two signal lead-in lines of one line set are provided with the signal lead-in line of another line set therebetween.

19 Claims, 35 Drawing Sheets

(56) References Cited

U.S. PATENT DOCUMENTS

| | | |
|---|---|---|
| 2019/0140029 A1 | 5/2019 | Kim et al. |
| 2020/0035162 A1 | 1/2020 | In |
| 2022/0061149 A1 | 2/2022 | Xiao |
| 2023/0141543 A1* | 5/2023 | Gu ........................ G11C 19/287 |
| | | 345/206 |

FOREIGN PATENT DOCUMENTS

| | | |
|---|---|---|
| CN | 105719593 A | 6/2016 |
| CN | 108873521 A | 11/2018 |
| CN | 109817182 A | 5/2019 |
| CN | 109951951 A | 6/2019 |
| CN | 111338137 A | 6/2020 |
| CN | 111415630 A | 7/2020 |
| CN | 111429859 A | 7/2020 |
| CN | 111624827 A | 9/2020 |
| CN | 112738999 A | 4/2021 |
| CN | 113177384 A | 7/2021 |
| CN | 113471225 A | 10/2021 |
| JP | 2019003141 A | 1/2019 |
| WO | 2018126723 A1 | 7/2018 |

\* cited by examiner

DISPLAY PANEL AND DISPLAY DEVICE

CROSS REFERENCE TO RELATED APPLICATIONS

The present disclosure is a US National Stage of International Application No. PCT/CN2021/143492, filed on Dec. 31, 2021, the entire contents of which are incorporated herein by reference.

FIELD

The present disclosure relates to the technical field of display, in particular to a display panel and a display device.

BACKGROUND

Typically, a display such as a liquid crystal display (LCD) or an organic light-emitting diode (OLED) display includes a plurality of pixel units. Each pixel unit may include a red sub-pixel, a green sub-pixel and a blue sub-pixel. With controlling the brightness of each sub-pixel, a color image may be displayed through mixed colors to be displayed.

SUMMARY

A display panel provided in an embodiment of the present disclosure includes: a base substrate including a non-display area; a gate drive circuit located in the non-display area, where the gate drive circuit includes a plurality of shift registers, and the plurality of shift registers are divided into a plurality of register sets; and a plurality of signal lead-in lines located in the non-display area, where the plurality of signal lead-in lines are divided into a plurality of line sets, and a frame start signal end of one register set is correspondingly and electrically connected to one line set; where two signal lead-in lines of one line set are provided with the signal lead-in line of another line set therebetween.

In some embodiments, the display panel further includes: a plurality of signal lead-in portions, where one of the plurality of line sets is electrically connected to one of the plurality of signal lead-in portions; and a plurality of bridge portions, where the bridge portions and the signal lead-in portions are located at different layers; where the signal lead-in portions and the signal lead-in lines are located at the same layer; and one of the plurality of line sets is electrically connected to the corresponding signal lead-in portion directly, and the remaining line sets are electrically connected to the corresponding signal lead-in portions by means of the bridge portions.

In some embodiments, the plurality of register sets include a first register set and a second register set; the plurality of line sets include a first line set and a second line set; the plurality of signal lead-in portions include a first signal lead-in portion and a second signal lead-in portion; a first end of the first line set is electrically connected to the first signal lead-in portion directly, and a second end of the first line set is electrically connected to a frame start signal end of the first register set; and a first end of the second line set is electrically connected to the second signal lead-in portion by means of the bridge portion, and a second end of the second line set is electrically connected to a frame start signal end of the second register set.

In some embodiments, the bridge portion includes a first bridge portion, a second bridge portion, and a third bridge portion connected between the first bridge portion and the second bridge portion; and the display panel further includes: a first bridge connection portion, where the first bridge connection portion, the bridge portions and the signal lead-in portions are located at different layers, a first end of the first bridge connection portion is electrically connected to the first bridge portion by means of a first adaption via hole, and a second end of the first bridge connection portion is electrically connected to the second signal lead-in portion by means of a second adaption via hole; and a second bridge connection portion, where the second bridge connection portion and the first bridge connection portion are located at the same layer, a first end of the second bridge connection portion is electrically connected to the second bridge portion by means of a third adaption via hole, and a second end of the second bridge connection portion is electrically connected to a signal lead-in line in the second line set by means of a fourth adaption via hole.

In some embodiments, the third bridge portion includes a plurality of third bridge sub-portions mutually arranged at intervals, and one third bridge sub-portion corresponds to one signal lead-in line; and the second bridge portion includes a plurality of second bridge sub-portion, and one second bridge sub-portion corresponds to one signal lead-in line.

In some embodiments, the plurality of second bridge sub-portions are mutually arranged at intervals; or, the plurality of second bridge sub-portions make contact with one another to form an integral structure.

In some embodiments, the second bridge connection portion includes a plurality of second bridge connection sub-portions mutually arranged at intervals, and one second bridge sub-portion is electrically connected to one second bridge connection sub-portion by means of the third adaption via hole.

In some embodiments, the first signal lead-in portion includes at least one first signal lead-in sub-portion and a third signal lead-in sub-portion, and the third signal lead-in sub-portion is electrically connected to the first end of the first line set directly; and the display panel further includes: a fifth bridge connection portion, where the fifth bridge connection portion and the first bridge connection portion are located at the same layer, the fifth bridge connection portion is electrically connected to each first signal lead-in sub-portion by means of a ninth adaption via hole, and the fifth bridge connection portion is electrically connected to the third signal lead-in sub-portion by means of a tenth adaption via hole.

In some embodiments, the signal lead-in line in the first line set includes a first signal lead segment and at least one second signal lead segment; and the display panel further includes: a plurality of fourth bridge connection portions, where the fourth bridge connection portions and the first bridge connection portion are located at the same layer; and in one signal lead-in line, the first signal lead segment and the second signal lead segment are electrically connected by means of the fourth bridge connection portion, and adjacent second signal lead segments are electrically connected by means of the fourth bridge connection portion.

In some embodiments, a first end of the first signal lead segment is electrically connected to the third signal lead-in sub-portion directly, a second end of the first signal lead segment is electrically connected to a first end of the corresponding fourth bridge connection portion by means of a fifth adaption via hole, and a second end of the fourth bridge connection portion is electrically connected to the second signal lead segment by means of a sixth adaption via hole; and one of the adjacent second signal lead segments is electrically connected to a first end of the corresponding fourth bridge connection portion by means of a seventh adaption via hole, and a second end of the fourth bridge connection portion is electrically connected to the other second signal lead segment by means of an eighth adaption via hole.

In some embodiments, second ends of the first signal lead segments in the first line set are mutually arranged at intervals; or, second ends of the first signal lead segments in the first line set make contact with one another to form an integral structure.

In some embodiments, the signal lead-in line in the second line set includes at least two third signal lead segments; and the display panel further includes: a plurality of third bridge connection portions, where in one signal lead-in line, two adjacent third signal lead segments are electrically connected by means of the third bridge connection portion, a first end of the third bridge connection portion is electrically connected to one third signal lead segment by means of a thirteenth adaption via hole, and a second end of the third bridge connection portion is electrically connected to the other third signal lead segment by means of a fourteenth adaption via hole.

In some embodiments, the plurality of fourth bridge connection portions are mutually arranged at intervals.

In some embodiments, a total number of the fourth bridge connection portions corresponding to one signal lead-in line in the first line set is equal to the sum of a total number of the third bridge connection portions and the second bridge connection portions corresponding to one signal lead-in line in the second line set.

In some embodiments, the second signal lead-in portion includes at least one second signal lead-in sub-portion; the first bridge connection portion is electrically connected to the second signal lead-in sub-portion by means of the second adaption via hole; and a total number of the first signal lead-in sub-portions is equal to a total number of the second signal lead-in sub-portions.

In some embodiments, the display panel further includes: a first auxiliary portion and a second auxiliary portion, where the first auxiliary portion, the second auxiliary portion and the bridge portions are located at the same layer; an orthographic projection of the first auxiliary portion on the base substrate is located between orthographic projections of the first signal lead-in sub-portion and the third signal lead-in sub-portion on the base substrate, and the fifth bridge connection portion is electrically connected to the first auxiliary portion by means of a fifteenth adaption via hole; and an orthographic projection of the second auxiliary portion on the base substrate is located between orthographic projections of the second signal lead-in sub-portion and the first bridge portion on the base substrate, and the first bridge connection portion is electrically connected to the second auxiliary portion by means of a sixteenth adaption via hole.

In some embodiments, the display panel further includes: a plurality of third auxiliary portions, where the third auxiliary portions, the first auxiliary portion and the bridge portion are located at the same layer; one signal lead-in line in the first line set is correspondingly provided with at least one third auxiliary portion; and in one signal lead-in line, the first signal lead segment is electrically connected to the second signal lead segment by means of the corresponding third auxiliary portion.

In some embodiments, the display panel further includes: a plurality of sixth bridge adaption portions and a plurality of seventh bridge adaption portions, where at least one third auxiliary portion is correspondingly provided with at least one sixth bridge adaption portion and at least one seventh bridge adaption portion; and a first end of the third auxiliary portion is electrically connected to the corresponding sixth bridge adaption portion by means of an eleventh adaption via hole, the sixth bridge adaption portion is electrically connected to the corresponding first signal lead segment by means of a twelfth adaption via hole, a second end of the third auxiliary portion is electrically connected to the corresponding seventh bridge adaption portion by means of a seventeenth adaption via hole, and the seventh bridge adaption portion is electrically connected to the corresponding second signal lead segment by means of an eighteenth adaption via hole.

In some embodiments, the bridge portion includes a fourth bridge portion, a sixth bridge portion, and a fifth bridge portion connected between the fourth bridge portion and the sixth bridge portion; the fourth bridge portion is electrically connected to the second signal lead-in portion by means of a first conduction via hole; and the sixth bridge portion is electrically connected to the signal lead-in line in the second line set by means of a second conduction via hole.

In some embodiments, the fifth bridge portion includes a plurality of fifth bridge sub-portions mutually arranged at intervals, the sixth bridge portion includes a plurality of sixth bridge sub-portions mutually arranged at intervals, and the fourth bridge portion is electrically connected to one signal lead-in line in the second line set by means of at least one fifth bridge sub-portion and at least one sixth bridge sub-portion.

In some embodiments, the first signal lead-in portion includes a first hollow area, the first hollow area includes a first bonding via hole, and the first bonding via hole penetrates the first signal lead-in portion.

In some embodiments, the first hollow area further includes a first bonding slit, and the first bonding slit penetrates the first signal lead-in portion.

In some embodiments, the display panel further includes: a fourth auxiliary portion and a fifth auxiliary portion, where the fourth auxiliary portion, the fifth auxiliary portion and the bridge portions are located at the same layer; the fourth auxiliary portion is electrically connected to the first signal lead-in portion by means of a third conduction via hole; and the fifth auxiliary portion is electrically connected to the second signal lead-in portion by means of a fourth conduction via hole.

In some embodiments, the signal lead-in line in the first line set includes a second hollow area, the second hollow area includes a second bonding via hole, and the second bonding via hole penetrates the signal lead-in line in the first line set.

In some embodiments, the second hollow area further includes a second bonding slit, and the second bonding slit penetrates the signal lead-in line in the first line set.

In some embodiments, the second hollow area further includes a second bonding via hole, the second bonding via hole penetrates the signal lead-in line in the first line set, and the second bonding via hole is located at one side, away from the first bonding via hole, of the second bonding slit; and one end, connected to the fifth bridge sub-portion, of the second signal lead-in line in the second line set is provided with a fourth bonding via hole, and the fourth bonding via hole is located at one side, away from the sixth bridge sub-portion, of the second conduction via hole.

A display device provided in an embodiment of the present disclosure includes the above display panel.

DETAILED DESCRIPTION OF THE EMBODIMENTS

Figure 1:
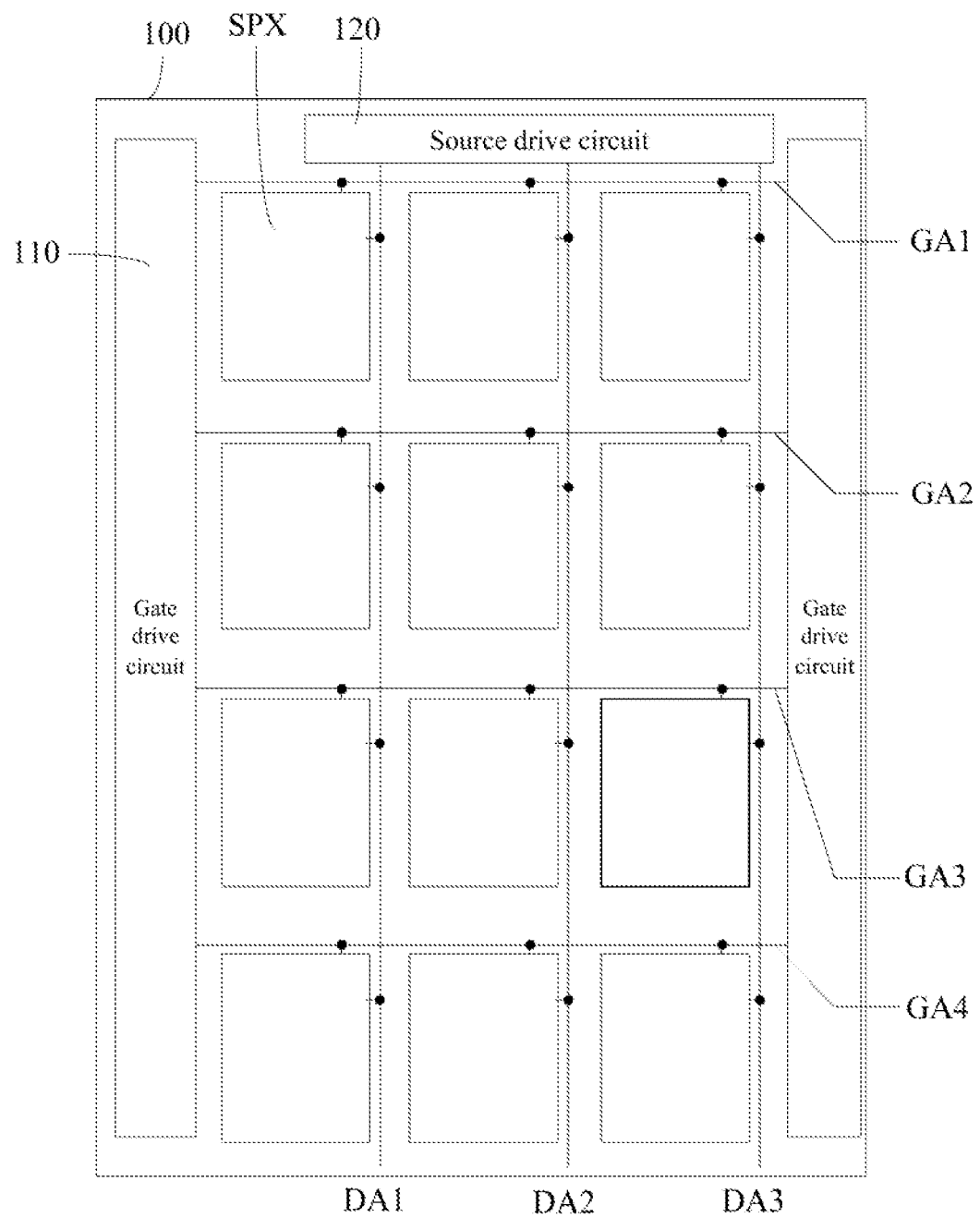
FIG. 1 is a schematic diagram of some structures of a display panel in an embodiment of the present disclosure.

For making the objectives, technical solutions and advantages of embodiments of the present disclosure more obvious, the technical solutions of the embodiments of the present disclosure will be clearly and completely described below in conjunction with the accompanying drawings in the embodiments of the present disclosure. Apparently, the embodiments described are some embodiments rather than all embodiments of the present disclosure. Furthermore, the embodiments in the present disclosure and features in the embodiments may be combined without conflicts. Based on the described embodiments of the present disclosure, all other embodiments acquired by those skilled in the art without making creative efforts fall within the scope of protection of the present disclosure.

Unless otherwise defined, technical or scientific terms used in the present disclosure are to be given their ordinary meaning as understood by those of ordinary skill in the art to which the present disclosure belongs. The use of "first", "second," and similar words in the present disclosure does not denote any order, total number, or importance, but is merely used to distinguish different components. Words such as "comprise" or "include" mean that elements or items appearing before the word encompass elements or items listed after the word and equivalents thereof, but do not exclude other elements or items. "Connect" or "connected" and like words are not restricted to physical or mechanical connections, but may include direct or indirect electrical connections.

It is to be noted that sizes and shapes of diagrams in the accompanying drawings do not reflect true scale, and are merely illustrative of the present disclosure. Furthermore, same or similar reference numerals refer to the same or similar elements or elements having the same or similar function throughout.

With reference to FIG. 1, a display panel may include a base substrate 100. The base substrate includes a display area and a non-display area surrounding the display area. The display area may include a plurality of pixel units arranged in an array, a plurality of gate lines GA (for example, GA1, GA2, GA3, and GA4), and a plurality of data lines DA (for example, DA1, DA2, and DA3). The non-display area may include a gate drive circuit 110 and a source drive circuit 120. Illustratively, the gate drive circuit 110 is electrically connected to the gate lines GA1, GA2, GA3 and GA4 respectively, and the source drive circuit 120 is electrically connected to the data lines DA1, DA2 and DA3 respectively. A signal may be input to the gate drive circuit 110 so as to make the gate drive circuit 110 output a signal to drive the gate lines GA1, GA2, GA3, and GA4. By inputting a signal to the source drive circuit 120, the source drive circuit 120 inputs data voltage to the data lines, to charge a sub-pixel (SPX), such that corresponding data voltage is inputted to the sub-pixel (SPX) to display a picture. Illustratively, two source drive circuits 120 may be provided, one source drive circuit 120 is connected to half the number of data lines, and the other source drive circuit 120 is connected to the other half of the number of data lines. Certainly, one, three, four or more source drive circuits 120 may be provided, which may be designed according to the requirements of practical applications, and are not limited herein.

Illustratively, each pixel unit includes a plurality of sub-pixels (SPX). For example, each pixel unit may include a red sub-pixel, a green sub-pixel and a blue sub-pixel, such that color mixing may be performed by red, green and blue to achieve color display. Alternatively, each pixel unit may further include a red sub-pixel, a green sub-pixel, a blue sub-pixel and a white sub-pixel, such that color mixing may be performed by red, green, blue and white to achieve color display. Certainly, in practical applications, a color of the sub-pixel in the pixel unit may be designed according to a practical application environment, and is not limited herein.

It is to be noted that the display panel in the embodiment of the present disclosure may be a liquid crystal display panel, an OLED display panel, etc., and is not limited herein.

In some embodiments, the gate drive circuit may include a plurality of shift registers, for example, the 1st to Nth stage shift registers: SR (1), SR (2), . . . SR (n−1), SR (n), . . . SR (N−1), and SR (N) (N shift registers in total, 1≤n≤N, n being an integer). The plurality of shift registers may be divided into a plurality of register sets. The shift registers in one register set may be arranged in cascade, and different register set are connected to different frame start signal ends.

Illustratively, the shift registers in the gate drive circuit may be divided into two register sets. For example, FIG. 2 shows the 1st to 24th stage shift registers SR (1)-SR (24).

Figure 2:
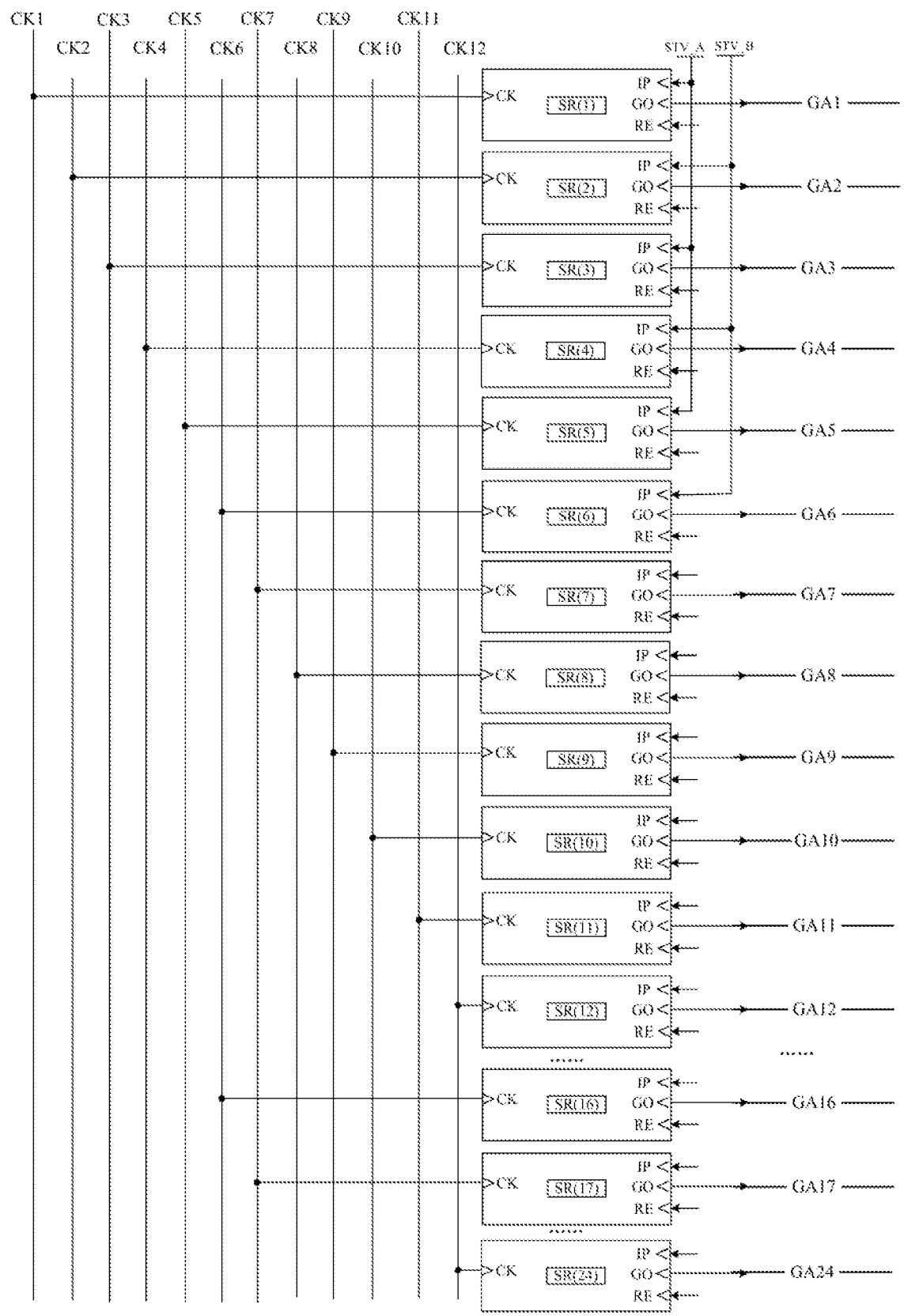
FIG. 2 is a schematic diagram of some structures of a gate drive circuit in an embodiment of the present disclosure.
Figure 3A:
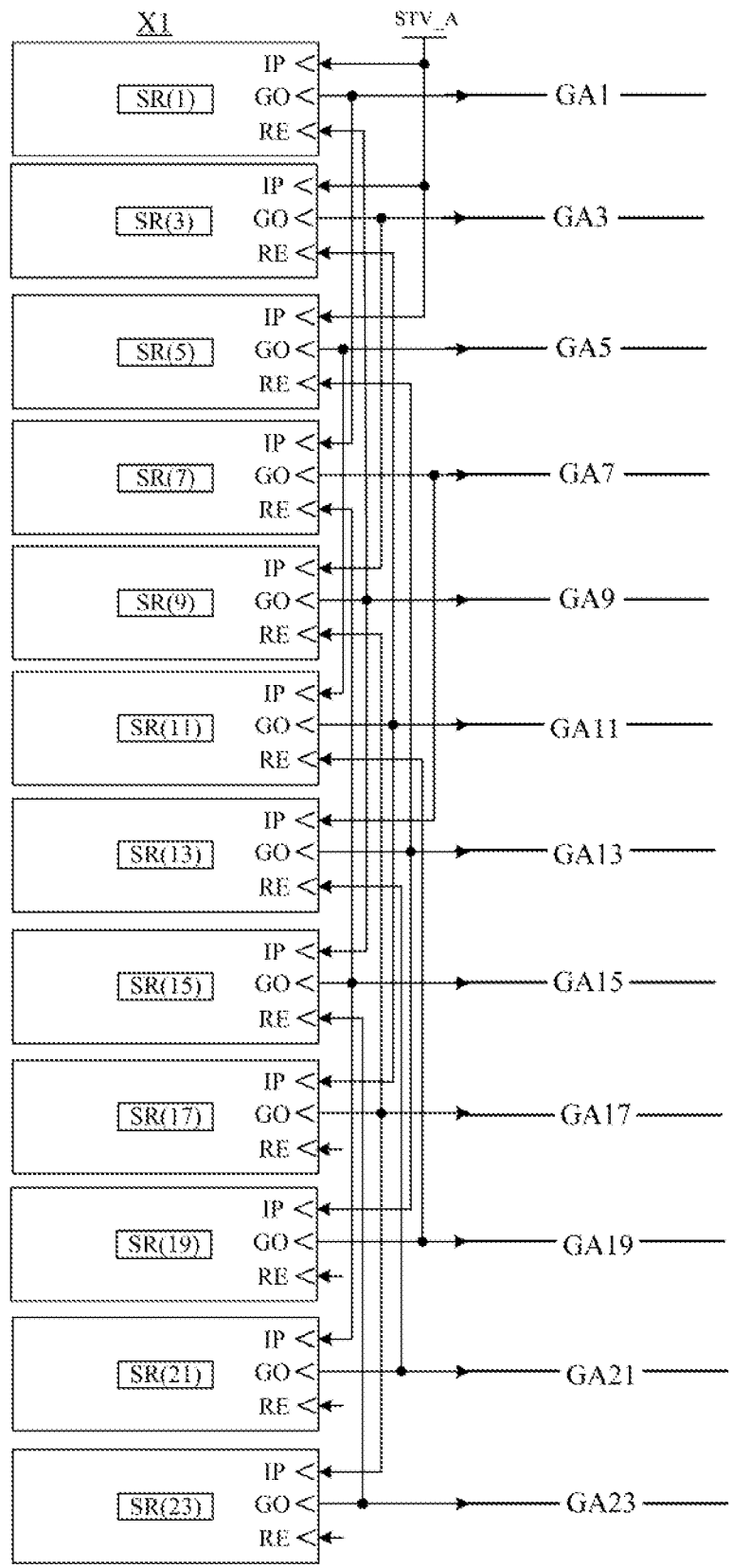
FIG. 3A is a schematic diagram of some structures of a first register set of a gate drive circuit in an embodiment of the present disclosure.

As shown in FIGS. 2 and 3A, the first register set X1 of the two register sets includes the odd-numbered shift registers: a 1st-stage shift register SR (1), a 3rd-stage shift register SR (3), a 5th-stage shift register SR (5), . . . a 19th-stage shift register SR (19), a 21st-stage shift register SR (21) and a 23rd-stage shift register SR (23). The odd-numbered stage shift register is electrically connected to the odd-numbered gate line. An input signal end IP of the 1st-stage shift register SR (1), an input signal end IP of the 3rd-stage shift register SR (3), and an input signal end IP of the 5th-stage shift register SR (5) are all electrically connected to the frame start signal end STV_A. An output signal end GO of the 1st-stage shift register SR (1) is electrically connected to an input signal end IP of the 7th-stage shift register SR (7). An output signal end GO of the 3rd-stage shift register SR (3) is electrically connected to an input signal end IP of the 9th-stage shift register SR (9) . . . . An output signal end GO of the 15th-stage shift register SR (15) is electrically connected to an input signal end IP of the 21st-stage shift register SR (21). An output signal end GO of the 17th-stage shift register SR (17) is electrically connected to an input signal end IP of the 23rd-stage shift register SR (23). An output signal end GO of the 9th-stage shift register SR (9) is electrically connected to a reset signal end RE of the 1st-stage shift register SR (1). An output signal end GO of the 11st-stage shift register SR (11) is electrically connected to a reset signal end RE of the 3rd-stage shift register SR (3) . . . . An output signal end GO of the 21st-stage shift register SR (21) is electrically connected to a reset signal end RE of the 13rd-stage shift register SR (13). An output signal end GO of the 23rd-stage shift register SR (23) is electrically connected to a reset signal end RE of the 15th-stage shift register SR (15).

Figure 3B:
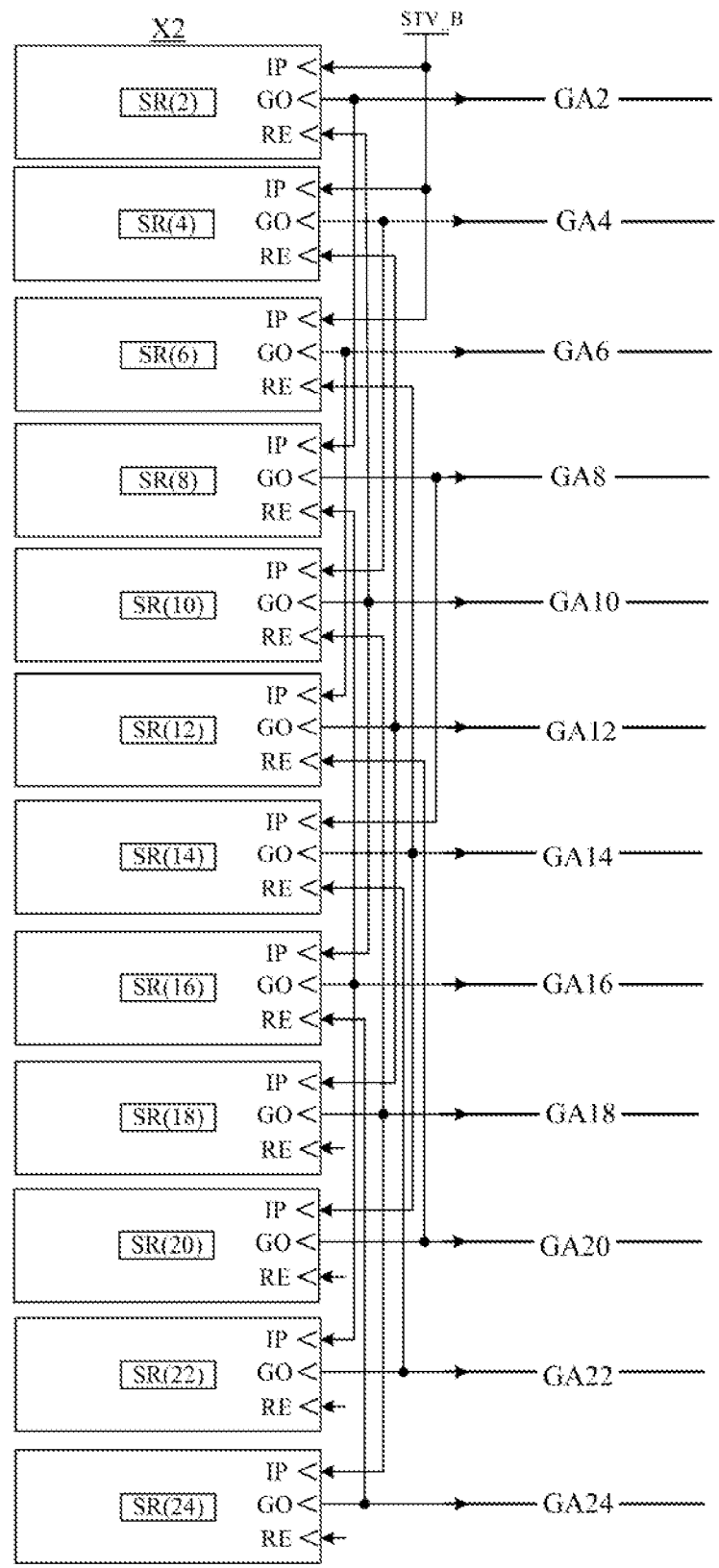
FIG. 3B is a schematic diagram of some structures of a second register set of a gate drive circuit in an embodiment of the present disclosure.

As shown in FIGS. 2 and 3B, the second register set X2 of the two register sets includes the even-numbered shift registers: a 2nd-stage shift register SR (2), a 4th-stage shift register SR (4), a 6th-stage shift register SR (6), . . . a 20th-stage shift register SR (20), a 22nd-stage shift register SR (22) and a 24th-stage shift register SR (24). The even-numbered stage shift register is electrically connected to the even-numbered gate line. An input signal end IP of the 2nd-stage shift register SR (2), an input signal end IP of the 4th-stage shift register SR (4), and an input signal end IP of the 6th-stage shift register SR (6) are all electrically connected to a frame start signal end STV_B. An output signal end GO of the 2nd-stage shift register SR (2) is electrically connected to an input signal end IP of the 8th-stage shift register SR (8). An output signal end GO of the 4th-stage shift register SR (4) is electrically connected to an input signal end IP of the 10th-stage shift register SR (10) . . . . An output signal end GO of the 16th-stage shift register SR (16) is electrically connected to an input signal end IP of the 22nd-stage shift register SR (22). An output signal end GO of the 18th-stage shift register SR (18) is electrically connected to an input signal end IP of the 24nd-stage shift register SR (24). An output signal end GO of the 10th-stage shift register SR (10) is electrically connected to a reset signal end RE of the 2nd-stage shift register SR (2). An output signal end GO of the 12th-stage shift register SR (12) is electrically connected to a reset signal end RE of the 4th-stage shift register SR (4) . . . . An output signal end GO of the 22nd-stage shift register SR (22) is electrically connected to a reset signal end RE of the 14th-stage shift register SR (14). An output signal end GO of the 24th-stage shift register SR (24) is electrically connected to a reset signal end RE of the 16th-stage shift register SR (16).

Figure 4:
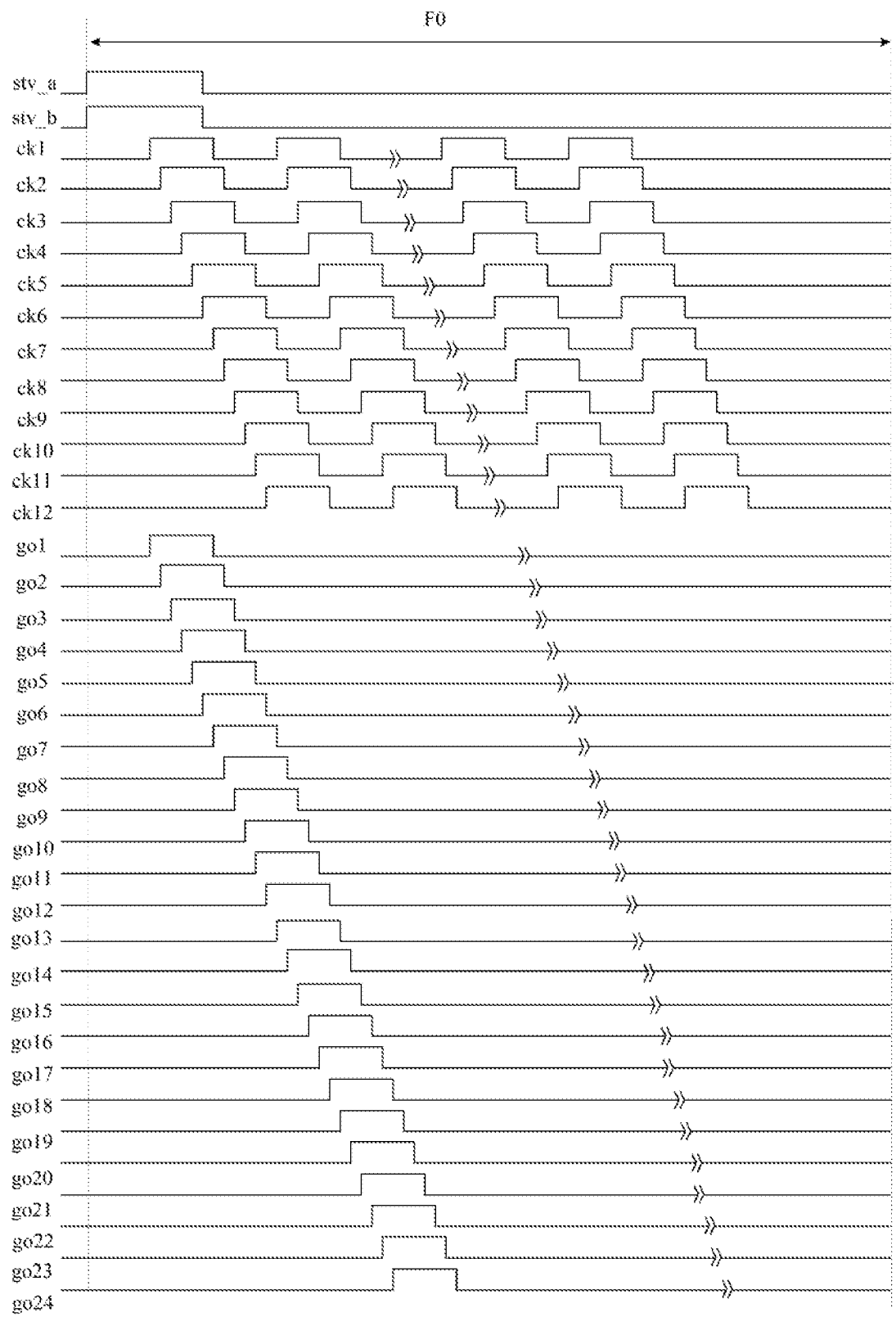
FIG. 4 is a signal timing diagram corresponding to a gate drive circuit in an embodiment of the present disclosure.

A signal timing diagram corresponding to a gate drive circuit as shown in FIG. 2 is shown in FIG. 4. stv_a represents a signal of the frame start signal end STV_A, stv_b represents a signal of the frame start signal end STV_B, ck1 represents a clock signal transmitted on a clock signal line CK1, ck2 represents a clock signal transmitted on a clock signal line CK2, ck3 represents a clock signal transmitted on a clock signal line CK3, ck4 represents a clock signal transmitted on a clock signal line CK4, ck5 represents a clock signal transmitted on a clock signal line CK5, ck6 represents a clock signal transmitted on a clock signal line CK6, ck7 represents a clock signal transmitted on a clock signal line CK7, ck8 represents a clock signal transmitted on a clock signal line CK8, ck9 represents a clock signal transmitted on a clock signal line CK9, ck10 represents a clock signal transmitted on a clock signal line CK10, ck11 represents a clock signal transmitted on a clock signal line CK11, and ck12 represents a clock signal transmitted on a clock signal line CK12. A signal go1 represents a gate drive signal output from the output signal end GO of the 1st-stage shift register SR (1). A signal go2 represents a gate drive signal output from the output signal end GO of the 2nd-stage shift register SR (2). A signal go3 represents a gate drive signal output from the output signal end GO of the 3rd-stage shift register SR (3) . . . . A signal go24 represents a gate drive signal output from the output signal end GO of the 24th-stage shift register SR (24).

It is to be noted that in the embodiments of the present disclosure, the shift registers in the gate drive circuit are described by way of example only by dividing the shift registers into two register sets. In practical applications, the shift registers in the gate drive circuit may be further divided into three register sets, four register sets or more, which are not limited herein.

In practical applications, the frame start signal end is electrically connected to the input signal end IP of the shift register by means of a signal lead-in line. However, the signal lead-in lines corresponding to one frame start signal end are arranged in one area, and no other signal lines are arranged between the signal lead-in lines corresponding to one frame start signal end, which is not conducive to the routing of the signal lead-in lines.

In the embodiments of the present disclosure, a plurality of signal lead-in lines are further provided in the non-display area. The plurality of signal lead-in lines are divided into a plurality of line sets, and one register set is electrically connected to one line set correspondingly. Two signal lead-in lines of one line set are provided with the signal lead-in line of another line set therebetween. Illustratively, the plurality of signal lead-in lines may be signal lines electrically connecting the frame start signal end to the input signal end IP of the shift register. Alternatively, the plurality of signal lead-in lines may be clock signal lines, or signal lines with other functions.

For example, when the plurality of signal lead-in lines are signal lines electrically connecting the frame start signal end to the input signal end IP of the shift register, in the embodiments of the present disclosure, the plurality of signal lead-in lines may be divided into two line sets in conjunction with FIGS. 2, 3A, 5A and 5B, wherein the first line set of the two line sets includes signal lead-in lines 110-1, 110-2 and 110-3, and the first line set is connected to the frame start signal end STV_A of the first register set X1. The signal lead-in line 110-1 is connected between the frame start signal end STV_A and the input signal end IP of the 1st-stage shift register SR (1), the signal lead-in line 110-2 is connected between the frame start signal end STV_A and the input signal end IP of the 3rd-stage shift register SR (3), and the signal lead-in line 110-3 is connected between the frame start signal end STV_A and the input signal end IP of the 5th-stage shift register SR (5).

Moreover, in conjunction with FIGS. 2, 3B, 5A, 5B and 6, the second line set of the two line sets includes signal lead-in lines 120-1, 120-2, and 120-3, and the second line set is connected to the frame start signal end STV_B of the second register set X2. The signal lead-in line 120-1 is connected between the frame start signal end STV_B and the input signal end IP of the 2nd-stage shift register SR (2), the signal lead-in line 120-2 is connected between the frame start signal end STV_B and the input signal end IP of the 4th-stage shift register SR (4), and the signal lead-in line 120-3 is connected between the frame start signal end STV_B and the input signal end IP of the 6th-stage shift register SR (6).

Figure 5A:
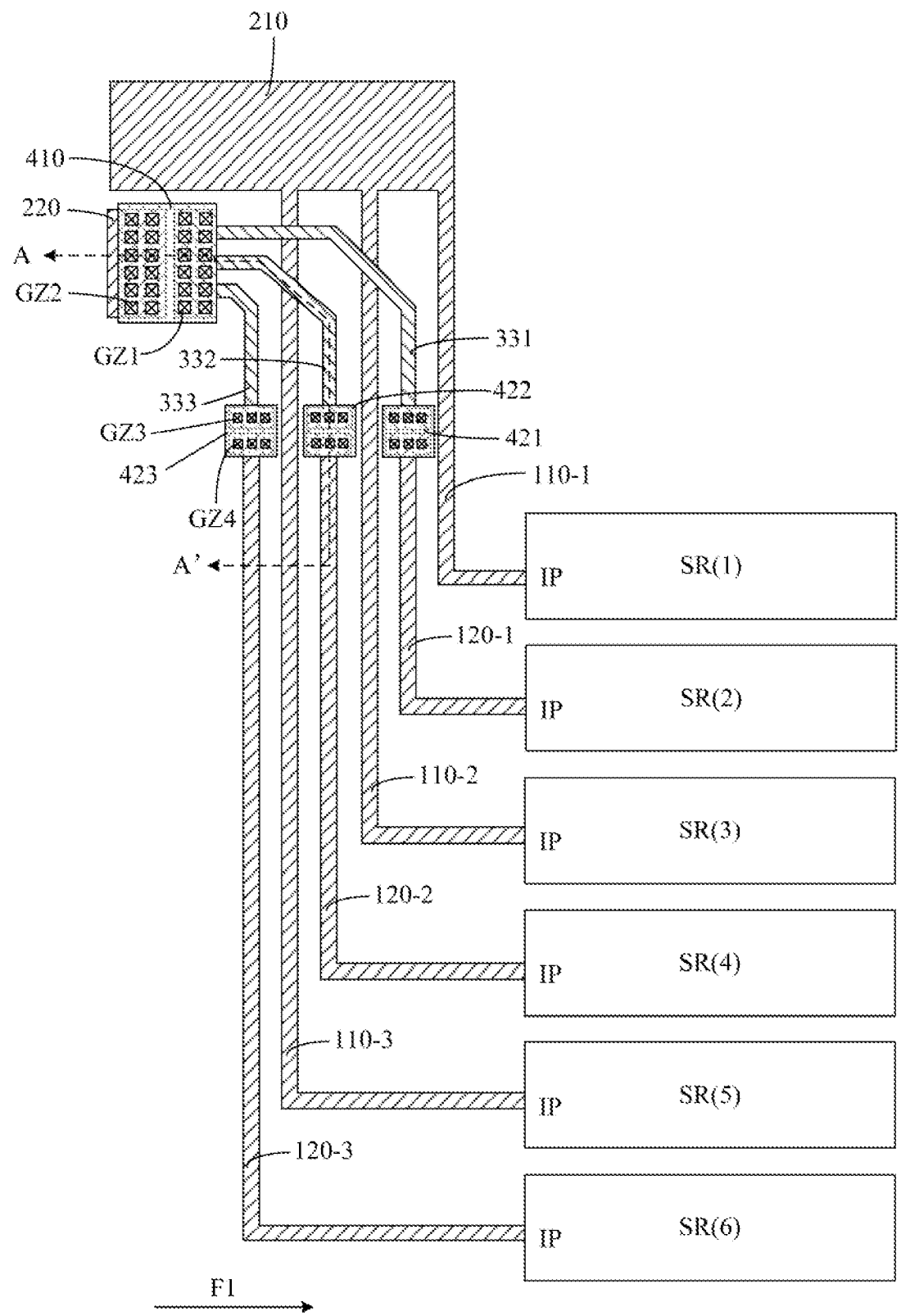
FIG. 5A is a schematic diagram of some layout structures of a display panel in an embodiment of the present disclosure.
Figure 5B:
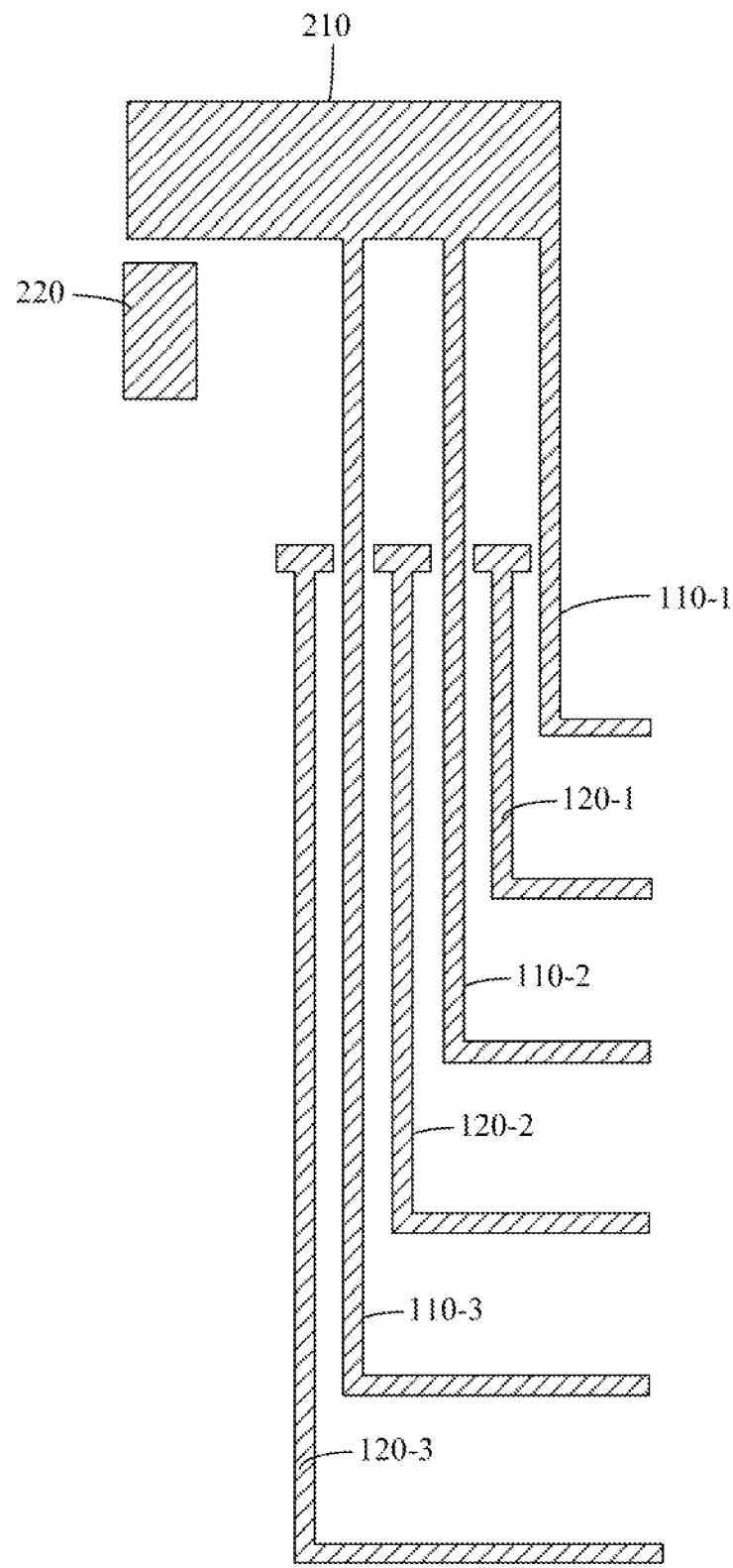
FIG. 5B is a schematic diagram of a layout structure of a layer where a signal lead-in line in FIG. 5A is located.

In conjunction with FIGS. 5A and 5B, the signal lead-in lines in the first line set and the signal lead-in lines in the second line set are alternately arranged. For example, the signal lead-in line 120-3, the signal lead-in line 110-3, the signal lead-in line 120-2, the signal lead-in line 110-2, the signal lead-in line 120-1, and the signal lead-in line 110-1 are sequentially arranged in a direction indicated by arrow F1. In this way, wiring space is optimized.

In the embodiment of the present disclosure, a transistor is arranged in the sub-pixel of the display panel, where the transistor has a gate, an active layer, a source and a drain. The gate and the gate line are arranged in the same layer and made of the same material, the source as well as the drain and the data line are arranged in the same layer and made of the same material, and the active layer may be located between the layer where the gate line is located and the layer where the data line is located. Moreover, a gate insulating layer is provided between the layer where the gate line is located and a layer where the active layer is located, and an interlayer insulating layer (for example, a PVX) is provided between the layer where the active layer is located and the layer where the data line is located.

In the embodiment of the present disclosure, the signal lead-in lines and the gate lines may be arranged in the same layer and made of the same material. In this way, when preparing a gate line, it is only necessary to change an original pattern of a mask when forming a pattern of the gate line, that is, the pattern of the gate line and a pattern of the signal lead-in line may be simultaneously formed by one patterning process, without adding a separate process for preparing the signal lead-in line, such that the preparation process flow may be simplified, a production cost may be saved, and production efficiency may be improved.

In the embodiment of the present disclosure, the display panel may further include: a plurality of signal lead-in portions and a plurality of bridge portions. The signal lead-in portions and the signal lead-in lines are located at the same layer and one of the plurality of line sets is electrically connected to the signal lead-in portions of the plurality of signal lead-in lines. Moreover, one of the plurality of line sets is electrically connected to the corresponding signal lead-in portion directly, and the remaining line sets are electrically connected to the corresponding signal lead-in portions by means of the bridge portions. For example, when the plurality of signal lead-in lines are signal lines electrically connecting the frame start signal end with the input signal end IP of the shift register, in the embodiment of the present disclosure, the plurality of signal lead-in portions include a first signal lead-in portion 210 and a second signal lead-in portion 220. In conjunction with FIGS. 2, 3A and 5A to 6, the first signal lead-in portion 210 is an integral structure using the same film layer material, and the signal lead-in lines 110-1, 110-2 and 110-3 in the first line set may be electrically connected to the first signal lead-in portion 210 directly, that is, the signal lead-in lines 110-1, 110-2 and 110-3 in the first line set are an lead-in line using same film layer materials with the first signal lead-in portion 210. The signal lead-in lines 120-1, 120-2, and 120-3 in the second line set may be electrically connected to the second signal lead-in portion 220 by means of the bridge portion 300. That is, a gap is provided between the signal lead-in lines 120-1, 120-2, and 120-3 in the second line set and the second signal lead-in portion 220.

Specifically, first ends of the signal lead-in lines 110-1, 110-2 and 110-3 in the first line set may be electrically connected to the first signal lead-in portion 210 directly, and second ends of the signal lead-in lines 110-1, 110-2 and 110-3 in the first line set may be electrically connected to the input signal end IP of the shift register in the first register set respectively. In this way, the signal stv_a input from the first signal lead-in portion 210 may be directly input into the input signal end IP of the 1st-stage shift register SR (1) by means of the signal lead-in line 110-1. The signal stv_a input from the first signal lead-in portion 210 may be directly input into the input signal end IP of the 3rd-stage shift register SR (3) by means of the signal lead-in line 110-2. The signal stv_a input from the first signal lead-in portion 210 may be directly input into the input signal end IP of the 5th-stage shift register SR (5) by means of the signal lead-in line 110-3.

First ends of the signal lead-in lines 120-1, 120-2, and 120-3 in the second line set may be electrically connected to the second signal lead-in portion 220 by means of the bridge portion 300. Second ends of the signal lead-in lines 120-1, 120-2 and 120-3 in the second line set may be electrically connected to the input signal end IP of the shift register in the second register set respectively. In this way, the signal stv_b input from the second signal lead-in portion 220 is input to the input signal end IP of the 2nd-stage shift register SR (2) by means of the bridge portion 300 and the signal lead-in line 120-1 by bridging sequentially. The signal stv_b input from the second signal lead-in portion 220 is input to the input signal end IP of the 4th-stage shift register SR (4) by means of the bridge portion 300 and the signal lead-in line 120-2 by bridging sequentially. The signal stv_b input from the second signal lead-in portion 220 is input to the input signal end IP of the 6th-stage shift register SR (6) by means of the bridge portion 300 and the signal lead-in line 120-3 by bridging sequentially.

In the embodiment of the present disclosure, the bridge portion and the signal lead-in portion are located at different layers. Illustratively, the bridge portion and the data line may be arranged on the same layer and made of the same material. In this way, when preparing a data line, it is only necessary to change an original pattern of a mask when forming a pattern of the data line, that is, the pattern of the data line and a pattern of the bridge portion may be simultaneously formed by one patterning process, without adding a separate process for preparing the bridge portion, such that the preparation process flow may be simplified, a production cost may be saved, and production efficiency may be improved.

Figure 5C:
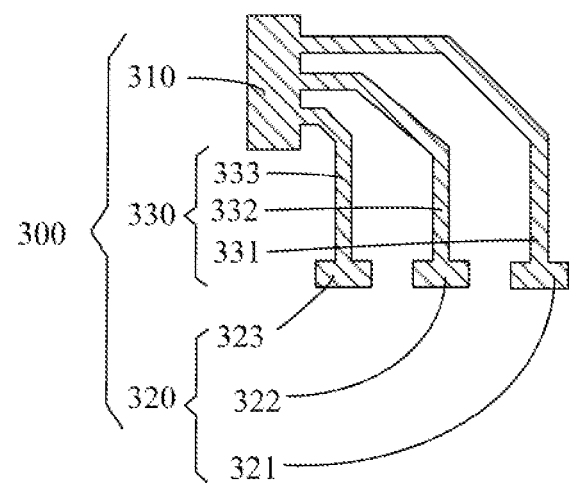
FIG. 5C is a schematic diagram of a layout structure of a layer where a bridge portion in FIG. 5A is located.
Figure 5D:
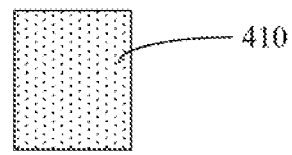
FIG. 5D is a schematic diagram of a layout structure of a layer where a first bridge connection portion in FIG. 5A is located.
Figure 5D:
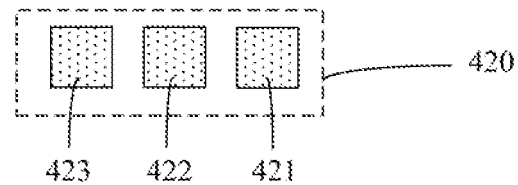
Figure 6:
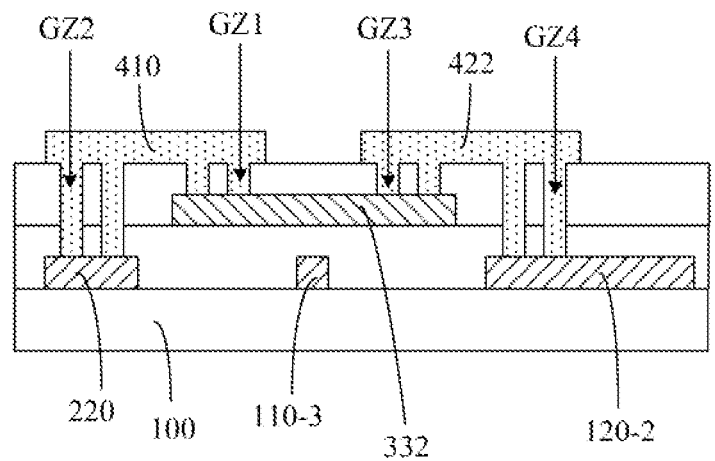
FIG. 6 is a schematic sectional view in direction AA' in FIG. 5A.

In the embodiment of the present disclosure, as shown in FIGS. 5A-6, the bridge portion may include a first bridge portion 310, a second bridge portion 320, and a third bridge portion 330 connected between the first bridge portion 310 and the second bridge portion 320. The display panel may further include: a first bridge connection portion 410 and a second bridge connection portion 420, where the first bridge connection portion 410, the bridge portion and the signal lead-in portion are located at different layers, and the second bridge connection portion 420 and the first bridge connection portion 410 are located at the same layer. Illustratively, when the display panel is a liquid crystal display panel, the first bridge connection portion 410, the second bridge connection portion 420 and a pixel electrode may be arranged on the same layer and made of the same material.

In the embodiment of the present disclosure, as shown in FIGS. 5A-6, a first end of the first bridge connection portion 410 is electrically connected to the first bridge portion 310 by means of a first adaption via hole GZ1, and a second end of the first bridge connection portion 410 is electrically connected to the second signal lead-in portion 220 by means of a second adaption via hole GZ2. A first end of the second bridge connection portion 420 is electrically connected to the second bridge portion 320 by means of a third adaption via hole GZ3, and a second end of the second bridge connection portion 420 is electrically connected to a signal lead-in line in the second line set by means of a fourth adaption via hole GZ4.

Illustratively, the first adaption via hole GZ1 penetrates the interlayer insulating layer. The second adaption via hole GZ2 penetrates the gate insulating layer and the interlayer insulating layer.

Illustratively, a total number of the first adaption via hole GZ1 may be equal to a total number of the second adaption via hole GZ2. For example, the total number of first adaption via holes GZ1 and the total number of second adaption via holes GZ2 may both be 12, 10, 8 or other numbers. Alternatively, a total number of the first adaption via hole GZ1 and a total number of the second adaption via hole GZ2 may also be different. Certainly, in practical applications, the total number of the first adaption via hole GZ1 and the total number of the second adaption via hole GZ2 may be designed according to the requirements of practical applications, and are not limited herein.

In the embodiment of the present disclosure, as shown in FIGS. 5A-6, the third bridge portion 330 may include a plurality of third bridge sub-portions mutually arranged at intervals, and the second bridge portion 320 includes a plurality of second bridge sub-portions. One third bridge sub-portion corresponds to a signal lead-in line, and one second bridge sub-portion corresponds to a signal lead-in line. For example, the second line set includes signal lead-in lines 120-1, 120-2 and 120-3, then the signal lead-in line 120-1 corresponds to the third bridge sub-portion 331 and the second bridge sub-portion 321, and the signal lead-in line 120-1 is electrically connected to the first bridge portion 310 by means of the second bridge sub-portion 321 and the third bridge sub-portion 331 sequentially. The signal lead-in line 120-2 corresponds to the third bridge sub-portion 332 and the second bridge sub-portion 322, and the signal lead-in line 120-2 is electrically connected to the first bridge portion 310 by means of the second bridge sub-portion 322 and the third bridge sub-portion 332 sequentially. The signal lead-in line 120-3 corresponds to the third bridge sub-portion 333 and the second bridge sub-portion 323, and the signal lead-in line 120-3 is electrically connected to the first bridge portion 310 by means of the second bridge sub-portion 323 and the third bridge sub-portion 333 sequentially. Thus, a signal transmission path is formed. By separating the plurality of third bridge sub-portions from one another, it is possible to reduce an overlapping area between the third bridge sub-portions and the signal lead-in line in the first line set, thereby reducing signal interference.

In the embodiment of the present disclosure, a shape of the third bridge sub-portion may be a non-linear shape, for example, as shown in FIG. 5C, the shape of the third sub-bridge (331, 332, 333) may be a bend line shape. Moreover, the third bridge sub-portion (331, 332, 333) may be in a shape of a bend line including three straight line segments and may have two bend angles, which may be obtuse angles. Alternatively, the third bridge sub-portion may be curved. The third bridge sub-portion may include a cambered curve. Certainly, in practical applications, the shape of the third bridge sub-portion may be determined according to the requirements of practical applications and is not limited herein.

In the embodiment of the present disclosure, as shown in FIGS. 5A, 5C and 6, a plurality of second bridge sub-portions may be mutually arranged at intervals. For example, gaps are provided between the second bridge sub-portions 321, 322 and 323, and an orthographic projection of the plurality of second bridge sub-portions on the base substrate does not overlap an orthographic projection of the signal lead-in line of the first line set on the base substrate. In this way, it is possible to reduce an overlapping area between the second bridge sub-portions and the signal lead-in line in the first line set, thereby reducing signal interference.

In the embodiment of the present disclosure, as shown in FIGS. 5A-6, the second bridge connection portion 420 may include a plurality of second bridge connection sub-portions mutually arranged at intervals, and one second bridge sub-portion is electrically connected to one second bridge connection sub-portion by means of the third adaption via hole GZ3. For example, the second bridge connection portion 420 includes three second bridge connection sub-portions 421, 422 and 423 mutually arranged at intervals. The second bridge connection sub-portion 421 is electrically connected to the second bridge sub-portion 321 by means of the third adaption via hole GZ3, and the second bridge connection sub-portion 421 is electrically connected to the signal lead-in line 120-1 by means of the fourth adaption via hole GZ4. In this way, the signal stv_b input from the second signal lead-in portion 220 is input to the input signal end IP of the 2nd-stage shift register SR (2) by means of the first bridge connection portion 410, the first bridge portion 310, the second bridge sub-portion 321, the second bridge connection sub-portion 421 and the signal lead-in line 120-1 sequentially.

The second bridge connection sub-portion 422 is electrically connected to the second bridge sub-portion 322 by means of the third adaption via hole GZ3, and the second bridge connection sub-portion 422 is electrically connected to the signal lead-in line 120-2 by means of the fourth adaption via hole GZ4. In this way, the signal stv_b input from the second signal lead-in portion 220 is input to the input signal end IP of the 4th-stage shift register SR (4) by means of the first bridge connection portion 410, the first bridge portion 310, the second bridge sub-portion 322, the second bridge connection sub-portion 422 and the signal lead-in line 120-2 sequentially.

The second bridge connection sub-portion 423 is electrically connected to the second bridge sub-portion 323 by means of the third adaption via hole GZ3, and the second bridge connection sub-portion 423 is electrically connected to the signal lead-in line 120-3 by means of the fourth adaption via hole GZ4. In this way, the signal stv_b input from the second signal lead-in portion 220 is input to the input signal end IP of the 6th-stage shift register SR (6) by means of the first bridge connection portion 410, the first bridge portion 310, the second bridge sub-portion 323, the second bridge connection sub-portion 423 and the signal lead-in line 120-3 sequentially.

Illustratively, the third adaption via hole GZ3 penetrates the interlayer insulating layer. The fourth adaption via hole GZ4 penetrates the gate insulating layer and the interlayer insulating layer.

In the embodiment of the present disclosure, as shown in FIGS. 5A and 5D, gaps may be provided between the second bridge connection sub-portions, and orthographic projections of the plurality of second bridge connection sub-portions on the base substrate do not overlap orthographic projections of the signal lead-in lines of the first line set on the base substrate. In this way, it is possible to reduce an overlapping area between the second bridge connection sub-portions and the signal lead-in line in the first line set, thereby reducing signal interference.

Illustratively, the total number of the third adaption via hole GZ3 and the total number of the fourth adaption via hole GZ4 corresponding to one second bridge connection sub-portion may be equal. For example, the total number of the third adaption via holes GZ3 and the total number of the fourth adaption via holes GZ4 corresponding to one second bridge connection sub-portion may both be 1, 2, 3 or other numbers. Alternatively, the total number of the third adaption via hole GZ3 and the total number of the fourth adaption via hole GZ4 corresponding to one second bridge connection sub-portion may also be different. Certainly, in practical applications, the total number of the corresponding third adaption via hole GZ3 and the total number of the corresponding fourth adaption via hole GZ4 may be designed according to the requirements of practical applications, and are not limited herein.

Figure 7A:
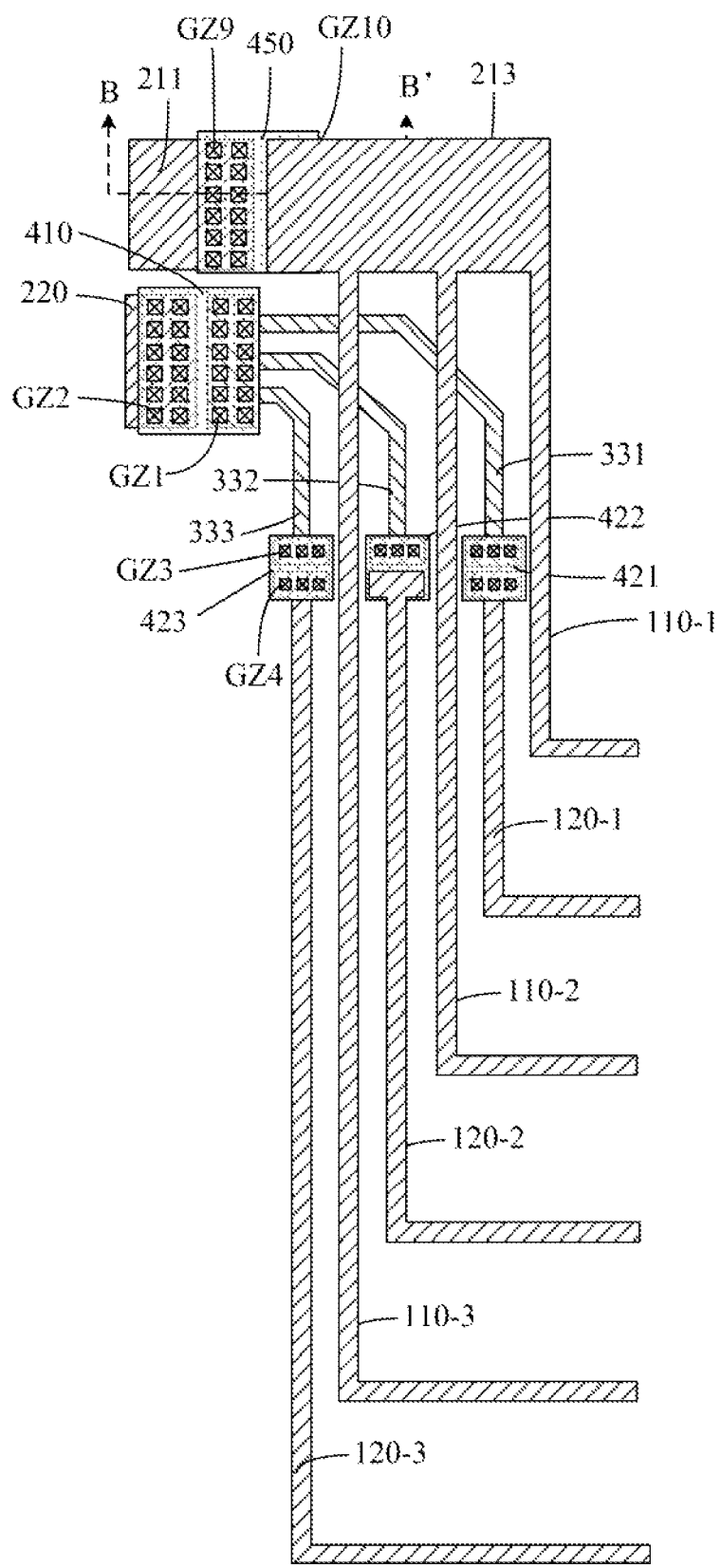
FIG. 7A is a schematic diagram of some other layout structures of a display panel in an embodiment of the present disclosure.
Figure 7B:
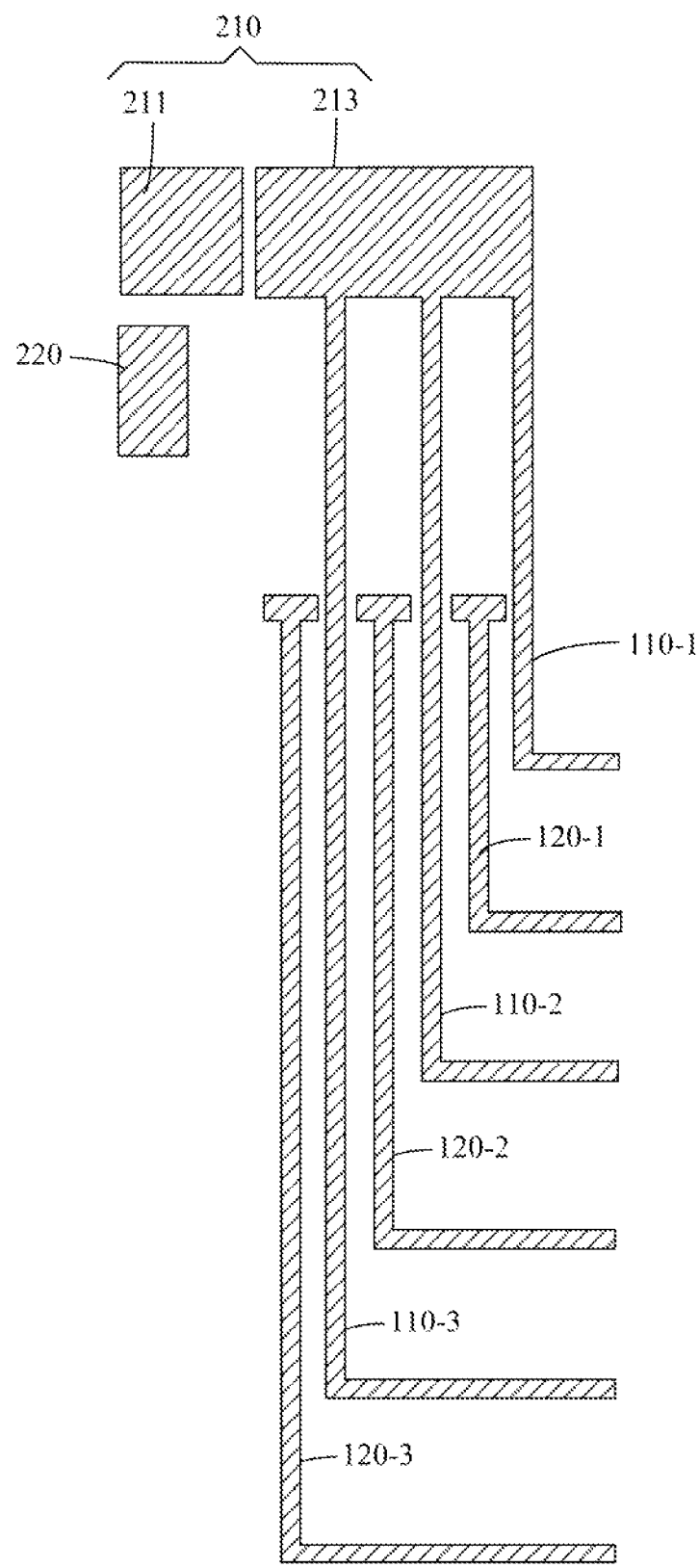
FIG. 7B is a schematic diagram of a layout structure of a layer where a signal lead-in line in FIG. 7A is located.
Figure 7C:
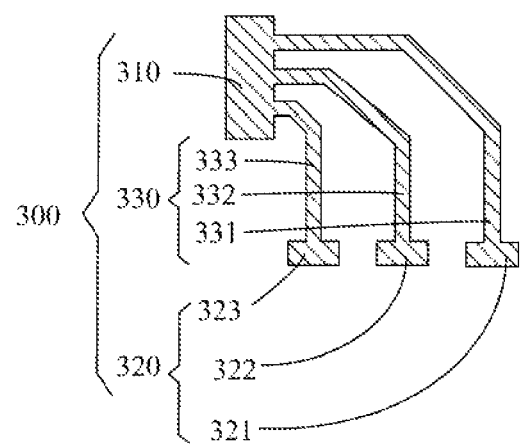
FIG. 7C is a schematic diagram of a layout structure of a layer where a bridge portion in FIG. 7A is located.
Figure 7D:
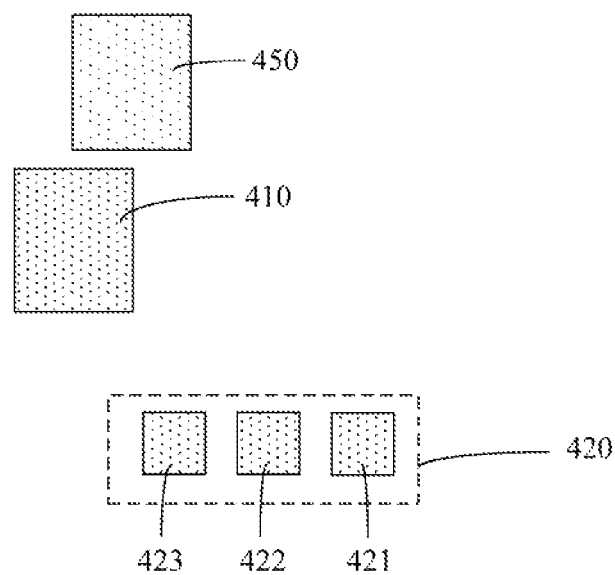
FIG. 7D is a schematic diagram of a layout structure of a layer where a first bridge connection portion in FIG. 7A is located.
Figure 8:
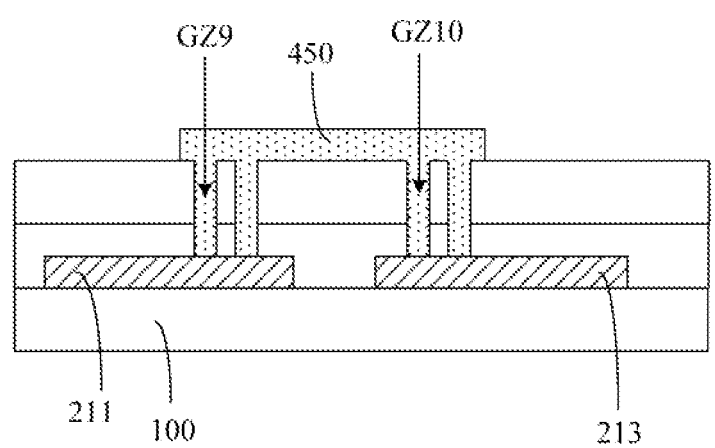
FIG. 8 is a schematic sectional view in direction BB' in FIG. 7A.

An embodiment of the present disclosure provides some other structural schematic diagrams of the display panel, as shown in FIGS. 7A-8, which are variations of the embodiments above. Herein, only the differences between this embodiment and the above embodiments will be described, and the same part will not be repeated herein.

In the embodiment of the present disclosure, as shown in FIGS. 7A-8, the first signal lead-in portion 210 may include at least one first signal lead-in sub-portion 211 and a third signal lead-in sub-portion 213, and the third signal lead-in sub-portion 213 is electrically connected to the first end of each signal lead-in line in the first line set directly. The display panel may further include: a fifth bridge connection portion 450, where the fifth bridge connection portion 450 and the first bridge connection portion 410 are located at the same layer. The fifth bridge connection portion 450 is electrically connected to each first signal lead-in sub-portion by means of a ninth adaption via hole GZ9, and the fifth bridge connection portion 450 is electrically connected to the third signal lead-in sub-portion 213 by means of a tenth adaption via hole GZ10.

Since the second signal lead-in portion 220 may be electrically connected to the signal lead-in line in the second line set only by means of a bridge portion, a resistance difference between a signal flow path, from the second signal lead-in portion 220 to the signal lead-in line in the second line set, corresponding to stv_b and a signal flow path, from the first signal lead-in portion 210 to the signal lead-in line in the first line set, corresponding to stv_a is large, resulting in a difference in the delay when the signals stv_a and stv_b are input into the signal input end IP, and then signals output by the output signal ends GO of the 1st-stage shift register, the 3rd-stage shift register and the 5th-stage shift register, and the 2nd-stage shift register, the 4th-stage shift register and the 6th-stage shift register have differences, resulting in different brightnesses of the corresponding sub-pixels, and affecting a display effect. In the embodiment of the present disclosure, the first signal lead-in portion 210 is divided into the first signal lead-in sub-portion 211 and the third signal lead-in sub-portion 213, and the first signal lead-in sub-portion 211 is electrically connected to the third signal lead-in sub-portion 213 by means of the fifth bridge connection portion 450, such that a resistance of a current flow path from the first signal lead-in portion 210 to the signal lead-in line in the first line set may be increased, and then a voltage difference between a flow path of the signal stv_a and a flow path of the signal stv_b may be reduced, so as to reduce a difference in delay when the signals stv_a and stv_b are input into the signal input end IP, and further to improve the display effect.

Illustratively, the ninth adaption via hole GZ9 penetrates the gate insulating layer and the interlayer insulating layer. The tenth adaption via hole GZ10 penetrates the gate insulating layer and the interlayer insulating layer.

Illustratively, in the embodiment of the present disclosure, as shown in FIGS. 7A-8, the first signal lead-in portion 210 may include a first signal lead-in sub-portion 211 and a third signal lead-in sub-portion 213. The second signal lead-in portion 220 includes a second signal lead-in sub-portion 221, that is, the second signal lead-in portion 220 servers as a second signal lead-in sub-portion, such that the number of the first signal lead-in sub-portion 211 is equal to the number of the second signal lead-in portion 220. The third signal lead-in sub-portion 213 is electrically connected to a first end of each of the signal lead-in lines 110-1, 110-2 and 110-3 in the first line set directly. A first end of the fifth bridge connection portion 450 is electrically connected to the first signal lead-in sub-portion by means of a ninth adaption via hole GZ9, and a second end of the fifth bridge connection portion 450 is electrically connected to the third signal lead-in sub-portion 213 by means of a tenth adaption via hole GZ10. In practical applications, the first signal lead-in sub-portion is electrically connected to a bonding end (PAD) of the input signal stv_a, such that the signal stv_a input to the bonding terminal (PAD) may be input to the signal input end IP of the corresponding shift register by means of the first signal lead-in sub-portion, the fifth bridge connection portion 450, the third signal lead-in sub-portion 213 and the signal lead-in lines 110-1, 110-2 and 110-3 in the first line set sequentially.

Illustratively, in the embodiment of the present disclosure, as shown in FIGS. 7A-8, the total number of the ninth adaption via hole GZ9 may be equal to the total number of the second adaption via hole GZ2. For example, the total number of ninth adaption via holes GZ9 and the total number of second adaption via holes GZ2 may both be 12, 8, 10 or other numbers. In practical applications, the total number of the ninth adaption via hole GZ9 and the total number of the second adaption via hole GZ2 may also be different. Certainly, the total number of the ninth adaption via hole GZ9 and the total number of the second adaption via hole GZ2 may be designed according to the requirements of practical applications, and are not limited herein.

Illustratively, in the embodiment of the present disclosure, as shown in FIGS. 7A-8, the total number of the tenth adaption via hole GZ10 may be equal to the total number of the first adaption via hole GZ1. For example, the total number of tenth adaption via holes GZ10 and the total number of first adaption via holes GZ1 may both be 12, 8, 10 or other numbers. In practical applications, the total number of the tenth adaption via hole GZ10 and the total number of the first adaption via hole GZ1 may also be different. Certainly, the total number of the tenth adaption via hole GZ10 and the total number of the first adaption via hole GZ1 may be designed according to the requirements of practical applications, and are not limited herein.

Figure 9A:
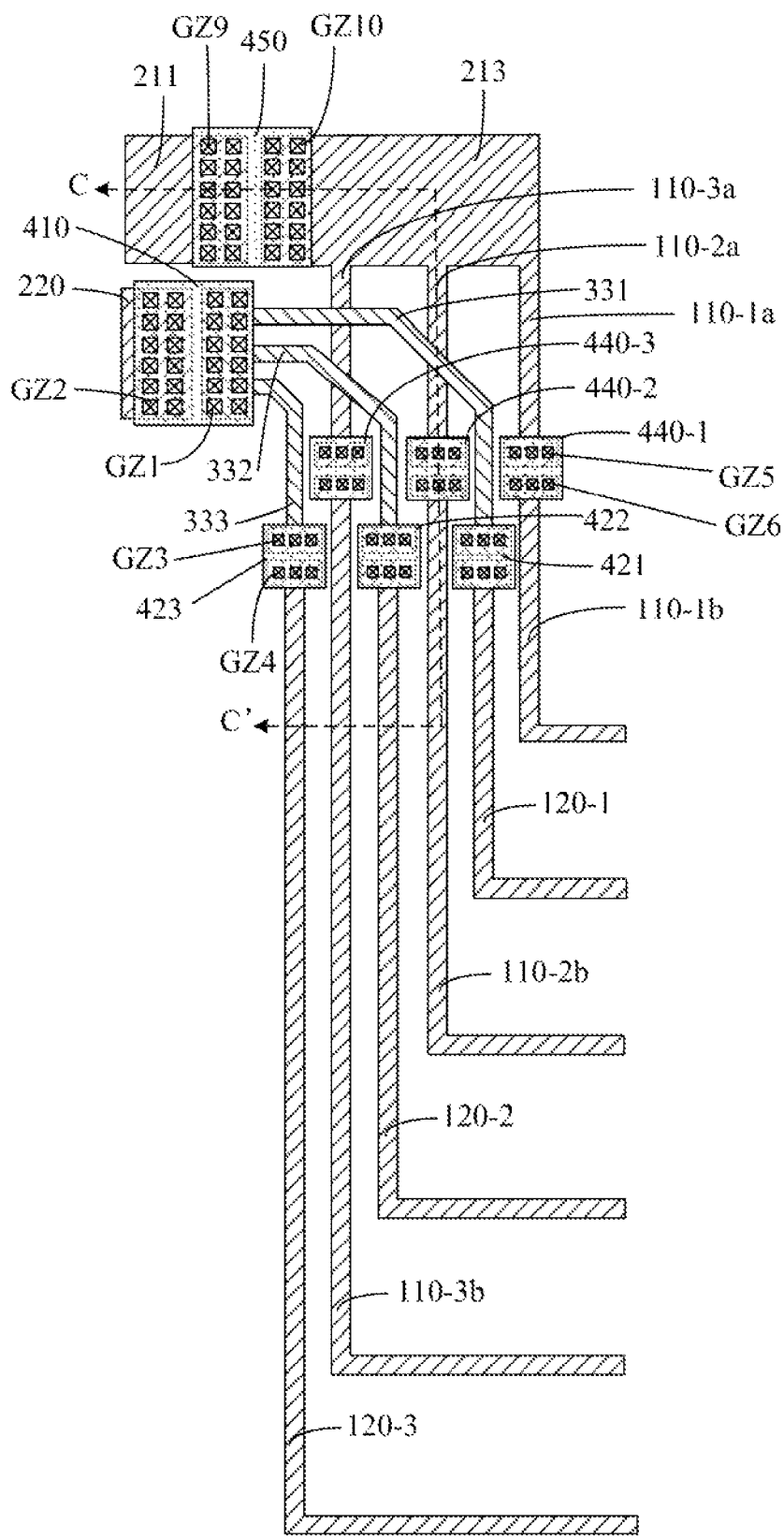
FIG. 9A is a schematic diagram of some other layout structures of a display panel in an embodiment of the present disclosure.
Figure 9B:
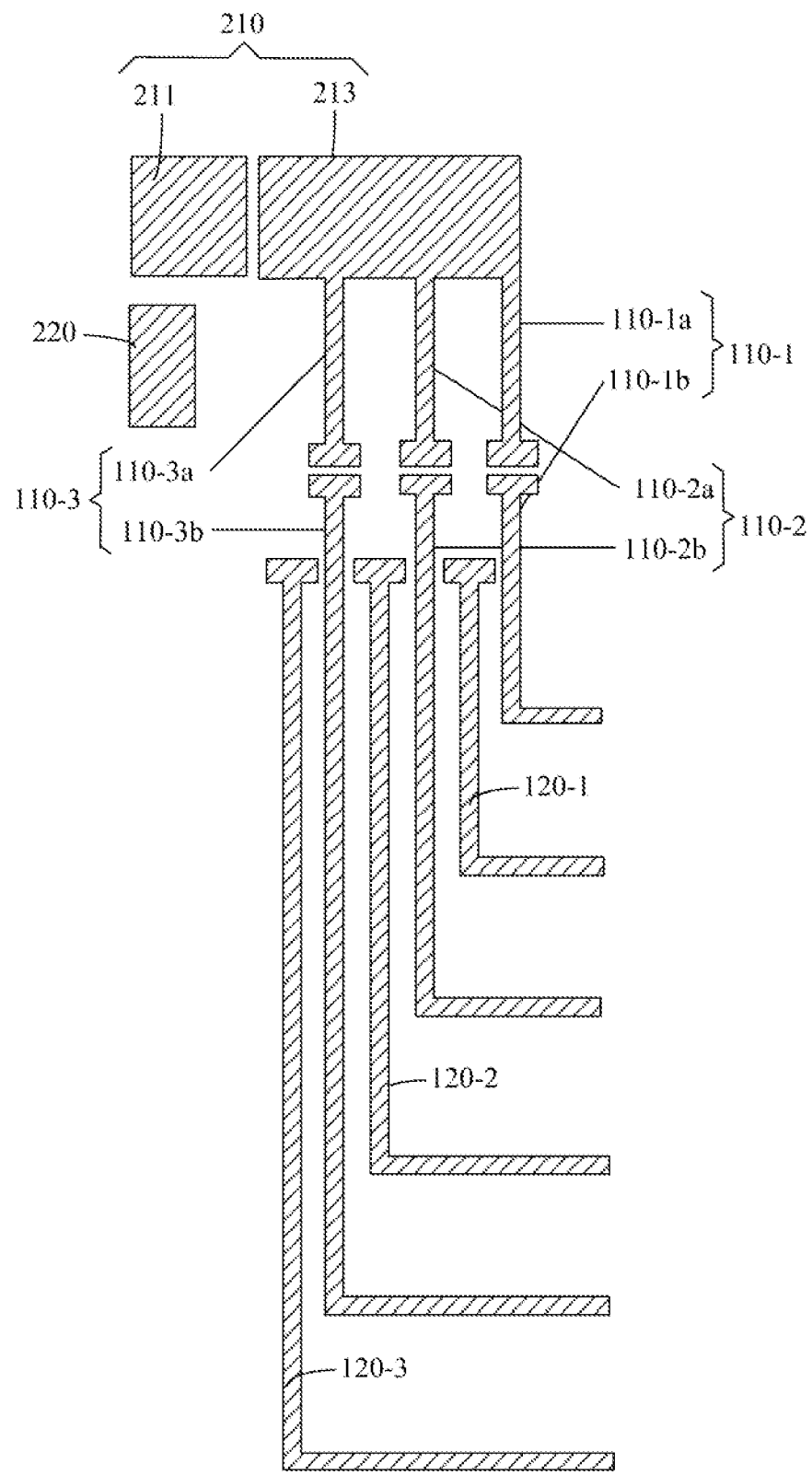
FIG. 9B is a schematic diagram of a layout structure of a layer where a signal lead-in line in FIG. 9A is located.
Figure 9C:
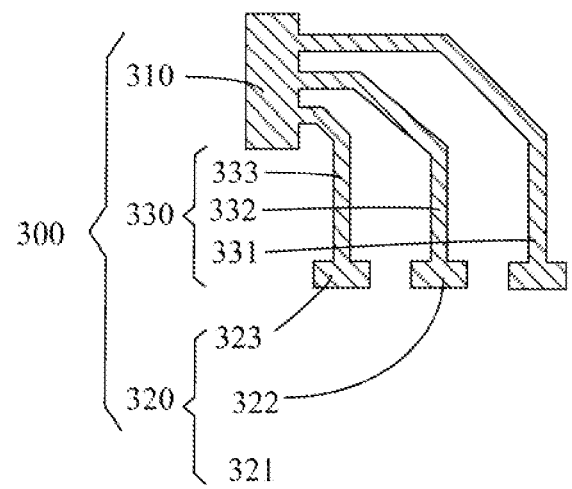
FIG. 9C is a schematic diagram of a layout structure of a layer where a bridge portion in FIG. 9A is located.
Figure 9D:
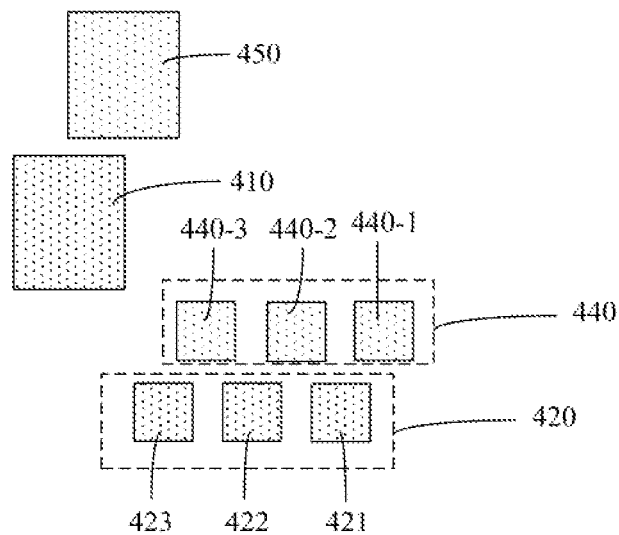
FIG. 9D is a schematic diagram of a layout structure of a layer where a first bridge connection portion in FIG. 9A is located.
Figure 10:
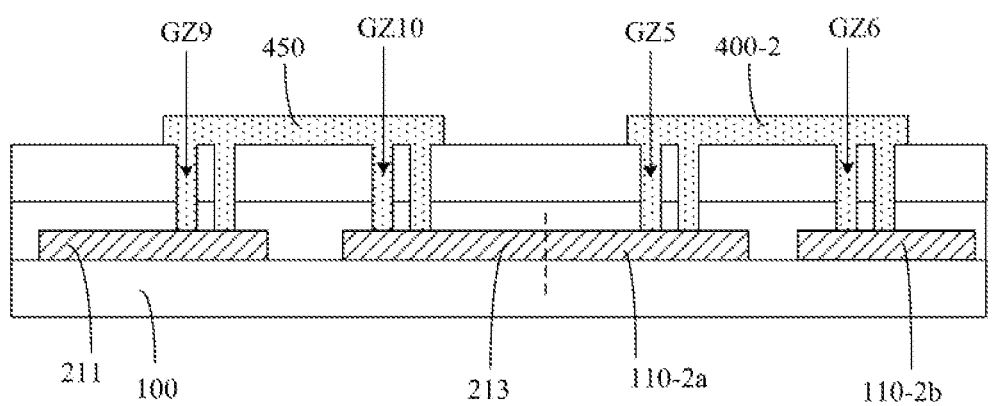
FIG. 10 is a schematic sectional view in direction CC' in FIG. 9A.
Figure 11A:
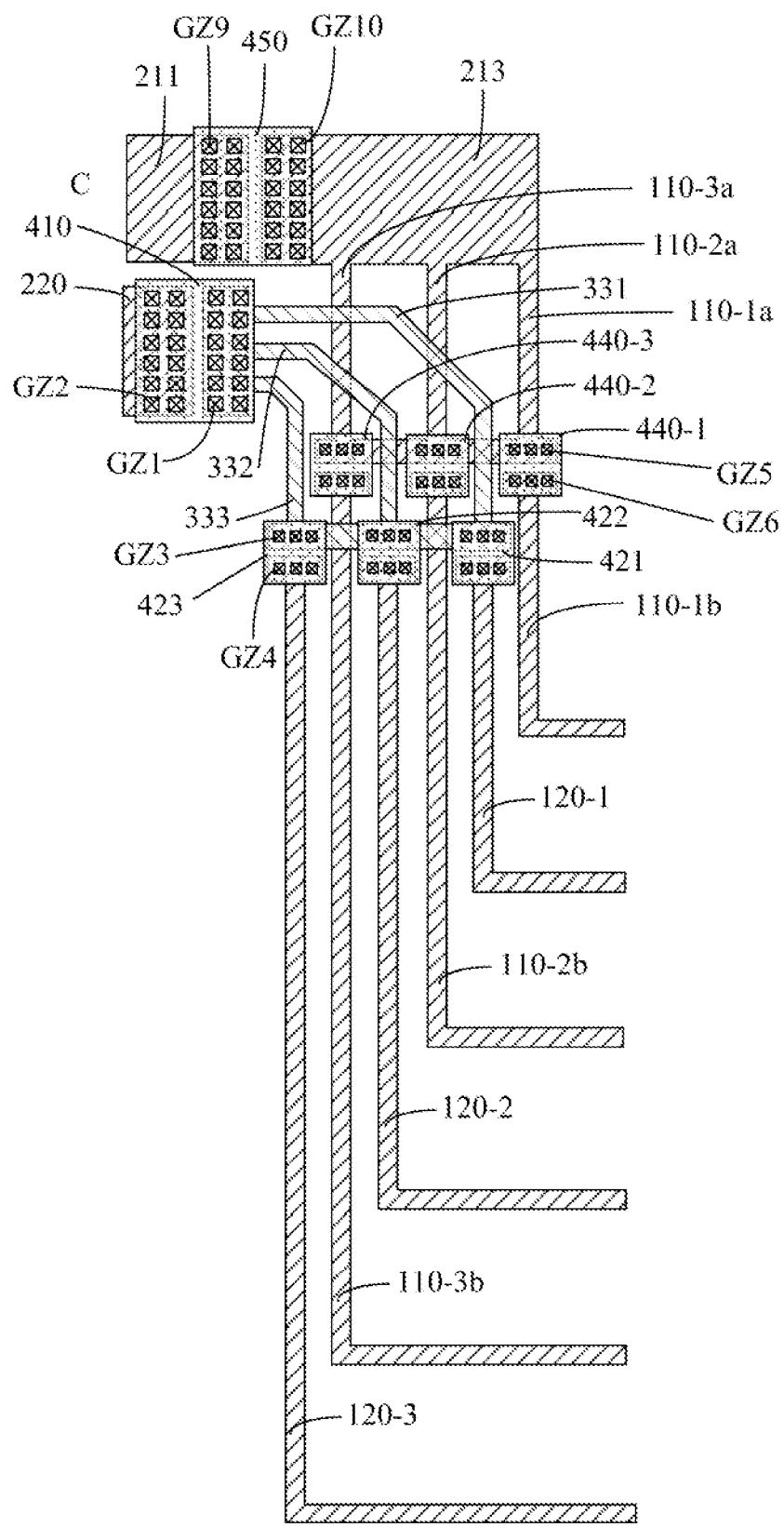
FIG. 11A is a schematic diagram of some other layout structures of a display panel in an embodiment of the present disclosure.
Figure 11B:
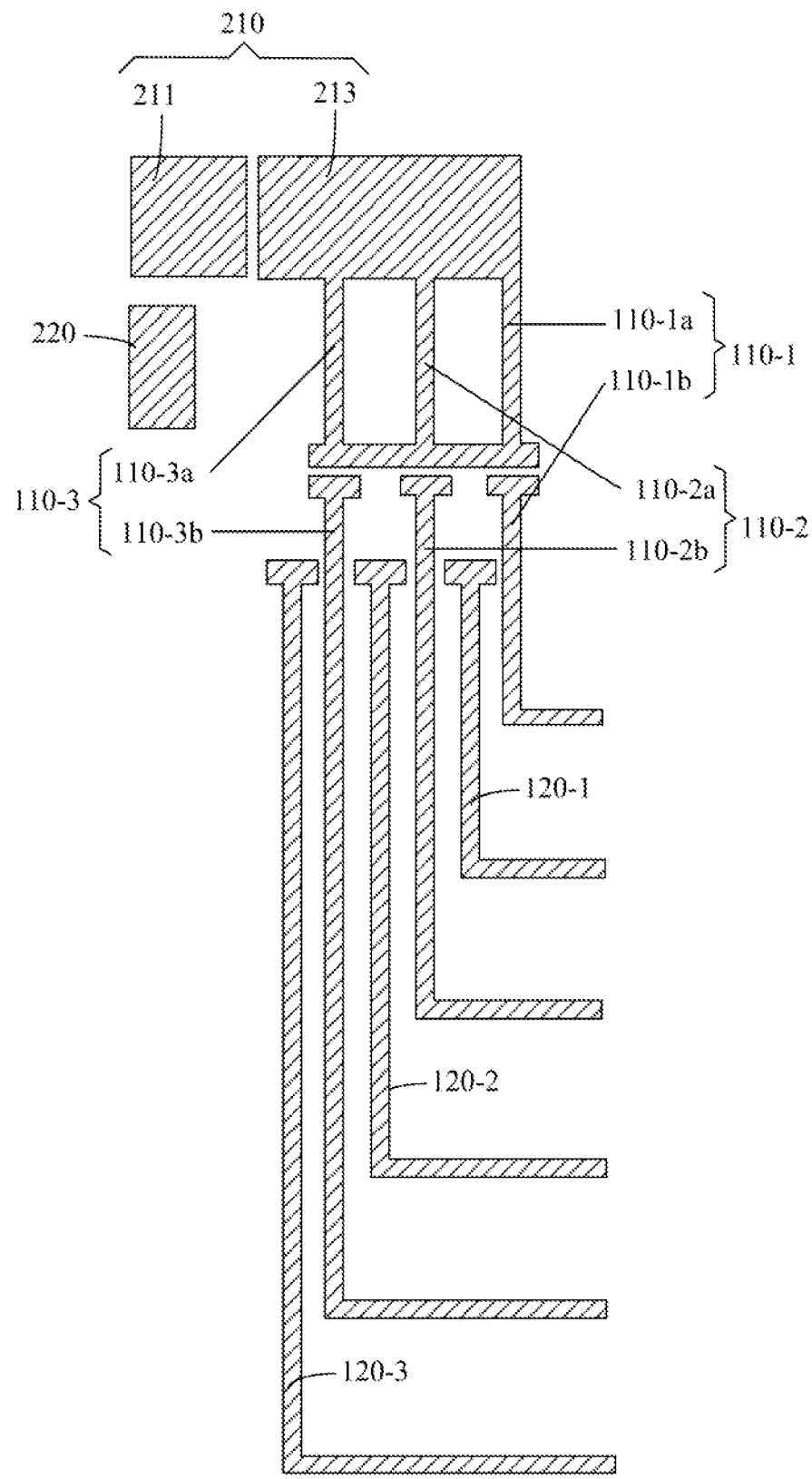
FIG. 11B is a schematic diagram of a layout structure of a layer where a signal lead-in line in FIG. 11A is located.
Figure 11C:
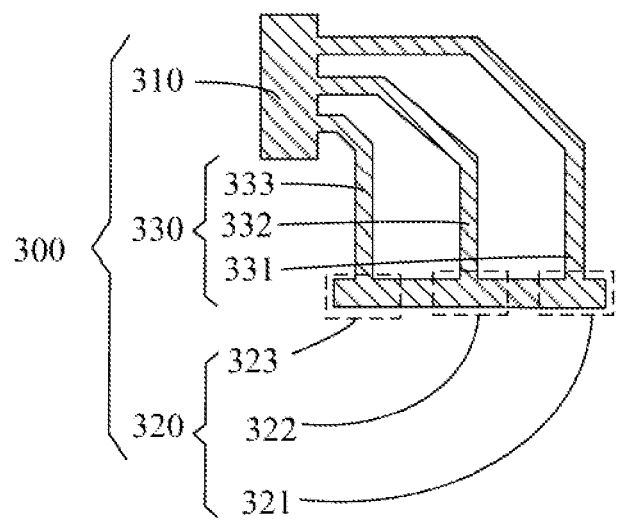
FIG. 11C is a schematic diagram of a layout structure of a layer where a bridge portion in FIG. 11A is located.
Figure 11D:
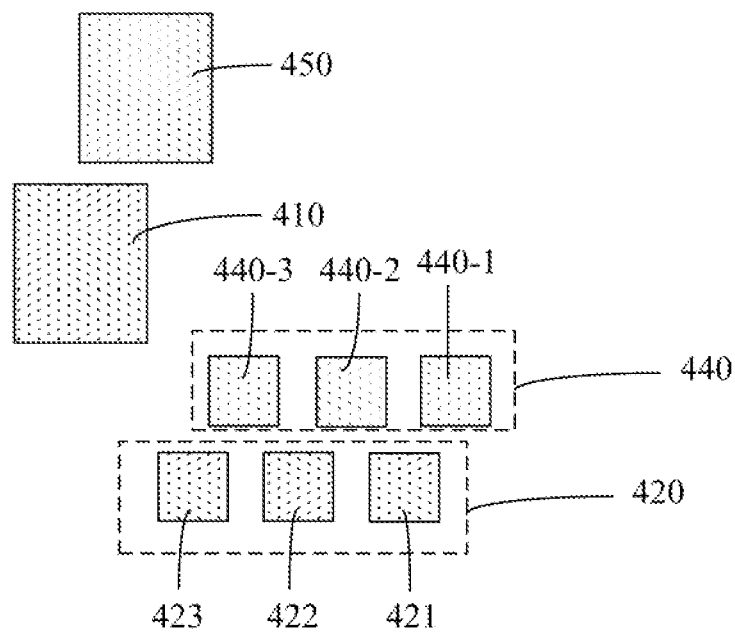
FIG. 11D is a schematic diagram of a layout structure of a layer where a first bridge connection portion in FIG. 11A is located.

An embodiment of the present disclosure further provides some other structural schematic diagrams of the display panel, as shown in FIGS. 9A-10, which are variations of the embodiments above. Herein, only the differences between this embodiment and the above embodiments will be described, and the same part will not be repeated herein.

In the embodiment of the present disclosure, as shown in FIGS. 9A-10, the signal lead-in line in the first line set includes one first signal lead segment and one second signal lead segment. The display panel further includes: a plurality of fourth bridge connection portions, where the fourth bridge connection portions and the first bridge connection portion 410 are located at the same layer; and in one signal lead-in line, the first signal lead segment and the second signal lead segment are electrically connected by means of the fourth bridge connection portion. Illustratively, the plurality of fourth bridge connection portions may be mutually arranged at intervals. Orthographic projections of the plurality of fourth bridge connection portions on the base substrate do not overlap orthographic projections of the signal lead-in lines in the first line set, the fourth bridge connection portions and the bridge portions on the base substrate. In this way, the signal interference may be further reduced.

Illustratively, in the embodiment of the present disclosure, as shown in FIGS. 9A-10, the signal lead-in line in the first line set includes one first signal lead segment and one second signal lead segment. In the signal lead-in line 110-1, the first signal lead segment 110-1*a* is electrically connected to the second signal lead segment 110-1*b* by means of the fourth bridge connection portion 440-1. In the signal lead-in line 110-2, the first signal lead segment 110-2*a* is electrically connected to the second signal lead segment 110-2*b* by means of the fourth bridge connection portion 440-2. In the signal lead-in line 110-3, the first signal lead segment 110-3*a* is electrically connected to the second signal lead segment 110-3*b* by means of the fourth bridge connection portion 440-3. In this way, a resistance difference between the signal lead-in line in the first line set and a signal lead-in line in the second line set may be reduced, so as to reduce delay of the signals stv_a and stv_b, and further to improve the display effect.

Illustratively, in the embodiment of the present disclosure, as shown in FIGS. 9A-10, a first end of the first signal lead segment 110-1*a* is electrically connected to the third signal lead-in sub-portion 213 directly, a second end of the first signal lead segment 110-1*a* is electrically connected to a first end of the corresponding fourth bridge connection portion 440-1 by means of a fifth adaption via hole GZ5, and a second end of the fourth bridge connection portion 440-1 is electrically connected to the second signal lead segment 110-1*b* by means of a sixth adaption via hole GZ6. A first end of the first signal lead segment 110-2*a* is electrically connected to the third signal lead-in sub-portion 213 directly, a second end of the first signal lead segment 110-2*a* is electrically connected to a first end of the corresponding fourth bridge connection portion 440-2 by means of a fifth adaption via hole GZ5, and a second end of the fourth bridge connection portion 440-2 is electrically connected to the second signal lead segment 110-2b by means of a sixth adaption via hole GZ6. A first end of the first signal lead segment 110-3a is electrically connected to the third signal lead-in sub-portion 213 directly, a second end of the first signal lead segment 110-3a is electrically connected to a first end of the corresponding fourth bridge connection portion 440-3 by means of a fifth adaption via hole GZ5, and a second end of the fourth bridge connection portion 440-3 is electrically connected to the second signal lead segment 110-3b by means of a sixth adaption via hole GZ6.

Illustratively, the fifth adaption via hole GZ5 penetrates the gate insulating layer and the interlayer insulating layer. The sixth adaption via hole GZ6 penetrates the gate insulating layer and the interlayer insulating layer.

Illustratively, in the embodiment of the present disclosure, as shown in FIGS. 9A-10, the second ends of the first signal lead segments in the first line set are mutually arranged at intervals. Gaps are provided between the second ends of the first signal lead segments in the first line set. For example, an orthographic projection of the second end of the first signal lead segment in the first line set on the base substrate does not overlap an orthographic projection of each signal lead-in line in the second line set on the base substrate.

Illustratively, in the embodiment of the present disclosure, when the signal lead-in line in the first line set includes a first signal lead segment and one second signal lead segment, the total number of the fifth adaption via hole GZ5 corresponding to one fourth bridge connection portion may be equal to a total number of the third adaption via hole GZ3 corresponding to one second bridge connection portion 420. For example, the total number of the fifth adaption via hole GZ5 corresponding to one fourth bridge connection portion and the total number of the third adaption via hole GZ3 corresponding to one second bridge connection portion 420 may both be 2, 3, 1 or other numbers. Alternatively, the total number of the fifth adaption via hole GZ5 corresponding to one fourth bridge connection portion and the total number of the third adaption via hole GZ3 corresponding to one second bridge connection portion 420 may also be different. Certainly, in practical applications, the total number of the fifth adaption via hole GZ5 corresponding to one fourth bridge connection portion and the total number of the third adaption via hole GZ3 corresponding to one second bridge connection portion 420 may be designed according to the requirements of practical applications, and are not limited herein.

Illustratively, in the embodiment of the present disclosure, when the signal lead-in line in the first line set includes one first signal lead segment and one second signal lead segment, a total number of the sixth adaption via hole GZ6 corresponding to one fourth bridge connection portion may be equal to a total number of the fourth adaption via hole GZ4 corresponding to one second bridge connection portion 420. For example, the total number of the sixth adaption via hole GZ6 corresponding to one fourth bridge connection portion and the total number of the fourth adaption via hole GZ4 corresponding to one second bridge connection portion 420 may both be 2, 3, 1 or other numbers. Alternatively, the total number of the sixth adaption via hole GZ6 corresponding to one fourth bridge connection portion and the total number of the fourth adaption via hole GZ4 corresponding to one second bridge connection portion 420 may also be different. Certainly, in practical applications, the total number of the sixth adaption via hole GZ6 corresponding to one fourth bridge connection portion and the total number of the fourth adaption via hole GZ4 corresponding to one second bridge connection portion 420 may be designed according to the requirements of practical applications, and are not limited herein.

An embodiment of the present disclosure further provides some other structural schematic diagrams of the display panel, as shown in FIGS. 11A-11D, which are variations of the embodiments above. Herein, only the differences between this embodiment and the above embodiments will be described, and the same part will not be repeated herein.

In the embodiment of the present disclosure, as shown in FIGS. 11A-11D, the second ends of the first signal lead segments in the first line set may make contact with one another to form an integral structure. That is, an orthographic projection of the integral structure formed by making contact with the second ends of the first signal lead segments in the first line set on the base substrate overlaps an orthographic projection of the signal lead-in line in the second line set on the base substrate.

In the embodiment of the present disclosure, as shown in FIGS. 11A-11D, a plurality of second bridge sub-portions may make contact with one another to form an integral structure. That is, an orthographic projection of the integral structure formed by making contact with the plurality of second bridge sub-portions on the base substrate overlaps an orthographic projection of the signal lead-in line in the first line set on the base substrate. For example, the second bridge connection portion 420 includes three second bridge connection sub-portions which make contact with one another to form an integral structure.

Figure 12A:
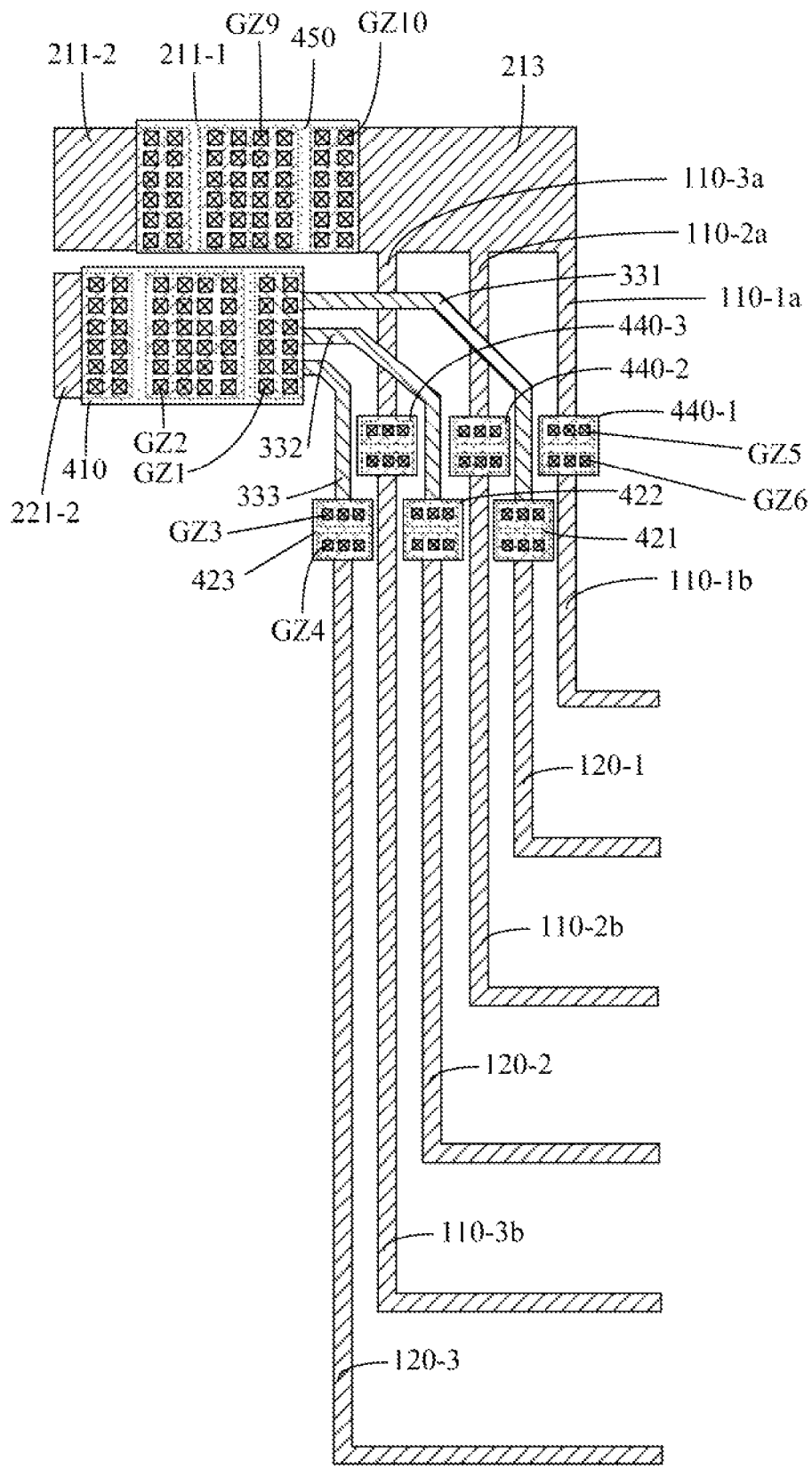
FIG. 12A is a schematic diagram of some other layout structures of a display panel in an embodiment of the present disclosure.
Figure 12B:
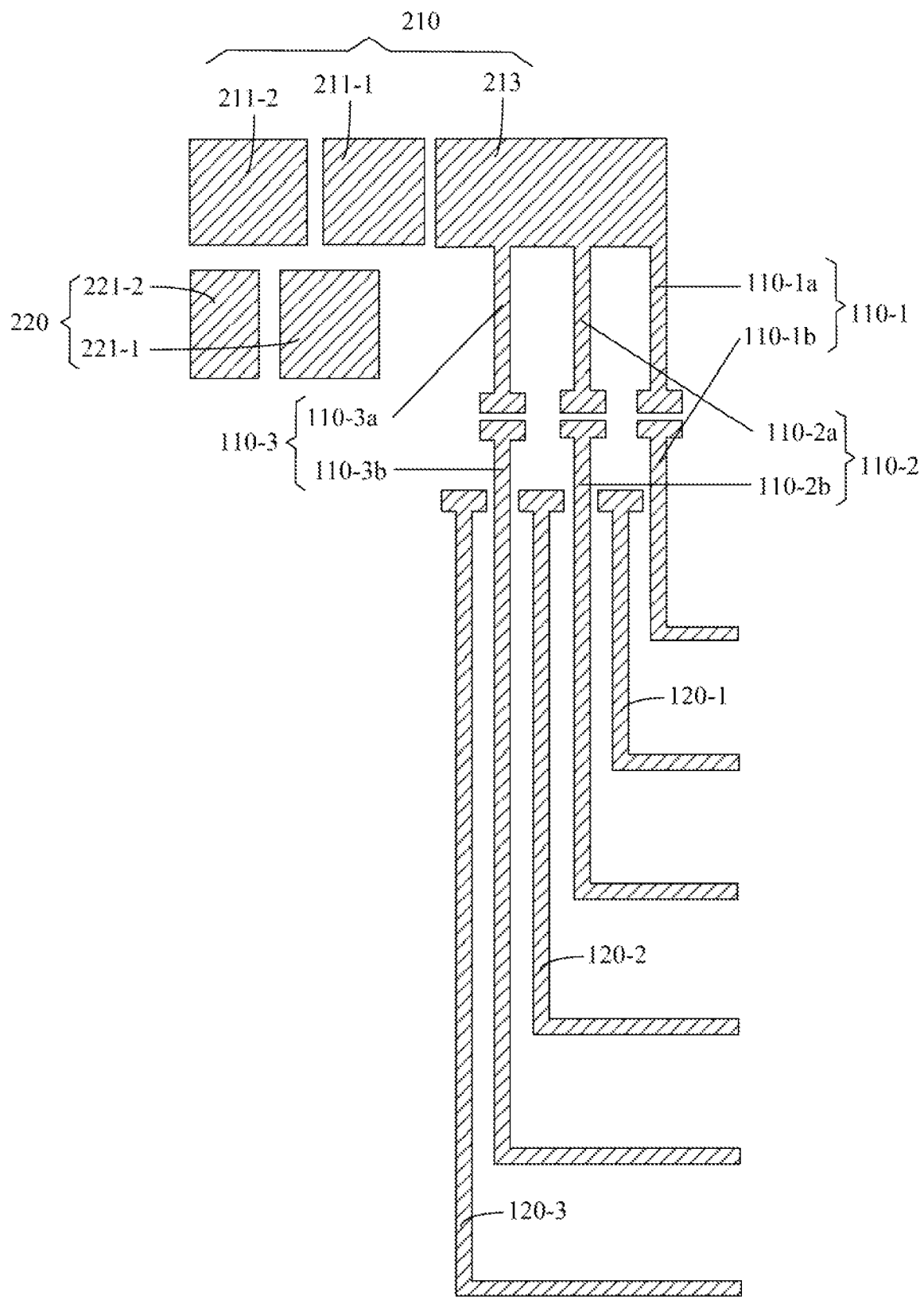
FIG. 12B is a schematic diagram of a layout structure of a layer where a signal lead-in line in FIG. 12A is located.

An embodiment of the present disclosure further provides some other structural schematic diagrams of the display panel, as shown in FIGS. 12A and 12B, which are variations of the embodiments above. Herein, only the differences between this embodiment and the above embodiments will be described, and the same part will not be repeated herein.

In the embodiment of the present disclosure, the second signal lead-in portion 220 includes at least one second signal lead-in sub-portion; the first bridge connection portion 410 is electrically connected to each second signal lead-in sub-portion by means of the second adaption via hole GZ2; and a total number of the first signal lead-in sub-portion is equal to a total number of the second signal lead-in sub-portion. The total number of the first signal lead-in sub-portion may be equal to the total number of the second signal lead-in sub-portion.

Illustratively, as shown in FIGS. 12A and 12B, the first signal lead-in portion 210 may include two first signal lead-in sub-portions 211-1, 211-2 and a third signal lead-in sub-portion 213. The second signal lead-in portion 220 may include: two second signal lead-in sub-portions 221-1 and 221-2. The fifth bridge connection portion 450 is electrically connected to the first signal lead-in sub-portions 211-1 and 211-2 by means of a ninth adaption via hole GZ9, and the fifth bridge connection portion 450 is electrically connected to the third signal lead-in sub-portion 213 by means of a tenth adaption via hole GZ10. The first bridge connection portion 410 is electrically connected to the second signal lead-in sub-portions 221-1 and 221-2 by means of the second adaption via hole GZ2.

Certainly, a total number of the first signal lead-in sub-portion and a total number of the second signal lead-in sub-portion may both be 3, 4 or more, and are not limited herein. Certainly, the total number of the first signal lead-in sub-portion and the total number of the second signal lead-in sub-portion may also be different. In practical applications, the total number of the first signal lead-in sub-portion and the total number of the second signal lead-in sub-portion may be designed according to the requirements of practical applications, and are not limited herein.

Figure 13A:
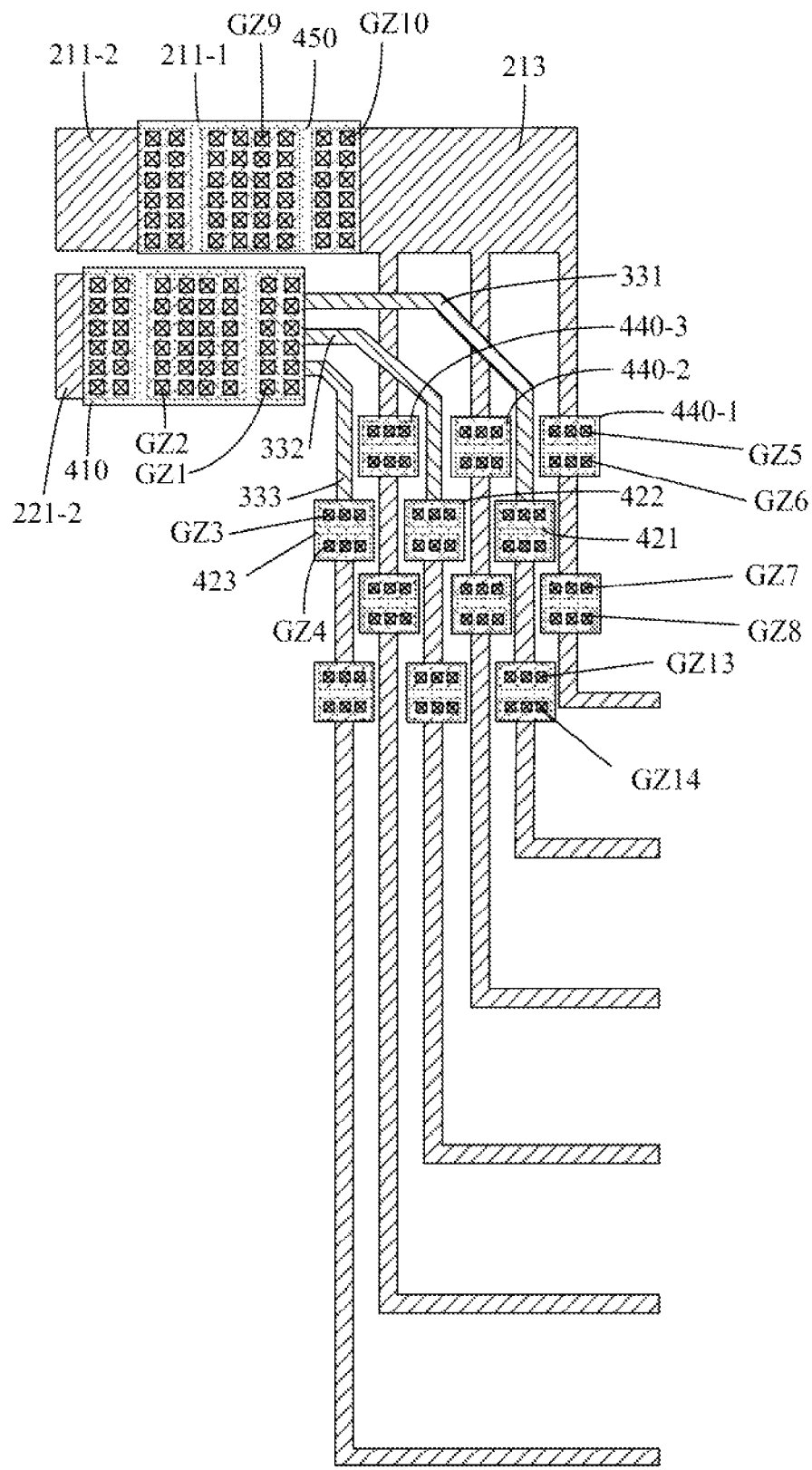
FIG. 13A is a schematic diagram of some other layout structures of a display panel in an embodiment of the present disclosure.
Figure 13B:
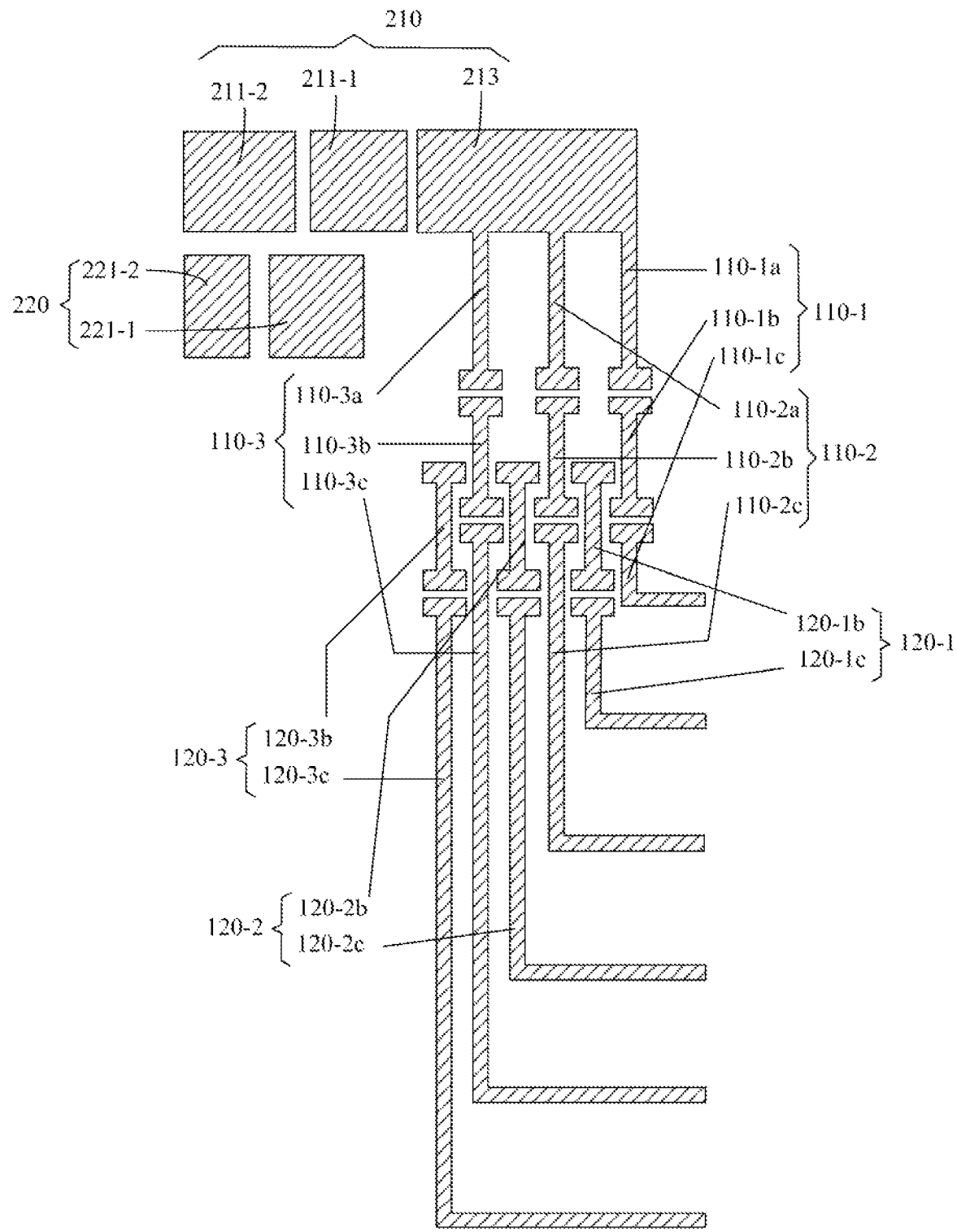
FIG. 13B is a schematic diagram of a layout structure of a layer where a signal lead-in line in FIG. 13A is located.

An embodiment of the present disclosure further provides some other structural schematic diagrams of the display panel, as shown in FIGS. 13A and 13B, which are variations of the embodiments above. Herein, only the differences between this embodiment and the above embodiments will be described, and the same part will not be repeated herein.

Figure 13C:
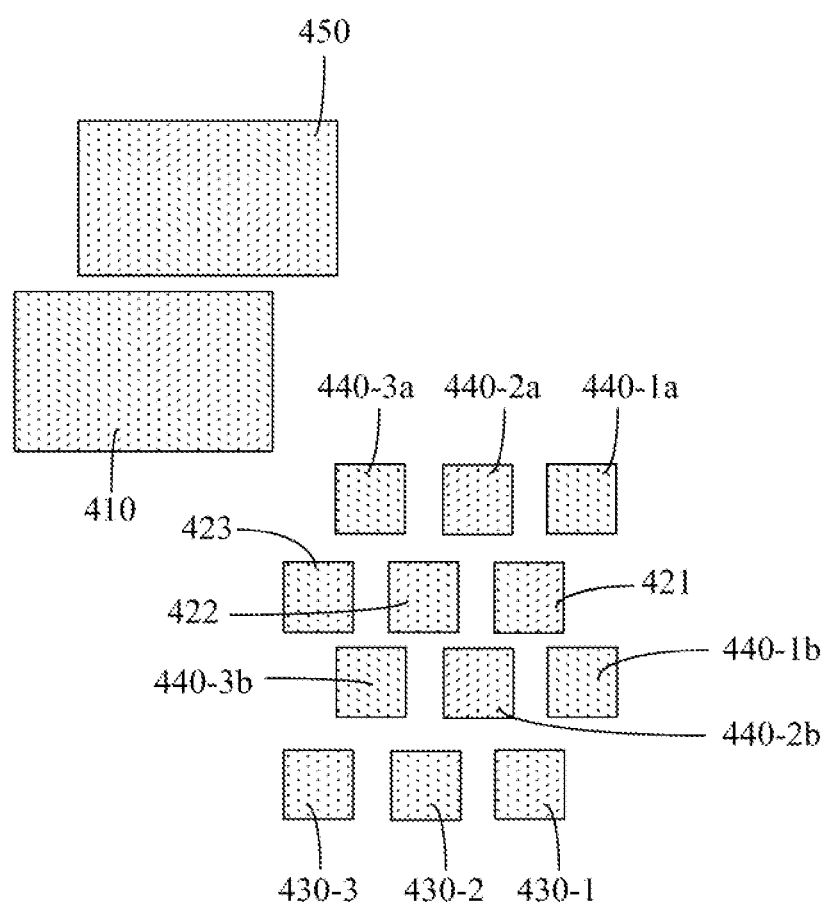
FIG. 13C is a schematic diagram of a layout structure of a layer where a first bridge connection portion in FIG. 13A is located.

In the embodiment of the present disclosure, as shown in FIGS. 13A-13C, the signal lead-in line in the first line set includes one first signal lead segment and at least two second signal lead segments. In one signal lead-in line, the first signal lead segment and the second signal lead segment are electrically connected by means of the fourth bridge connection portion, and adjacent second signal lead segments are electrically connected by means of the fourth bridge connection portion. Illustratively, one of the adjacent second signal lead segments is electrically connected to a first end of the corresponding fourth bridge connection portion by means of a seventh adaption via hole GZ7, and a second end of the fourth bridge connection portion is electrically connected to the other second signal lead segment by means of an eighth adaption via hole GZ8.

Illustratively, the seventh adaption via hole GZ7 penetrates the gate insulating layer and the interlayer insulating layer. The eighth adaption via hole GZ8 penetrates the gate insulating layer and the interlayer insulating layer.

In the embodiment of the present disclosure, as shown in FIGS. 13A-13C, the signal lead-in line in the second line set includes at least two third signal lead segments; and the display panel further includes: a plurality of third bridge connection portions (for example, 430-1, 430-2, 430-3), where in one signal lead-in line, two adjacent third signal lead segments are electrically connected by means of the third bridge connection portion, a first end of the third bridge connection portion is electrically connected to one third signal lead segment by means of a thirteenth adaption via hole GZ13, and a second end of the third bridge connection portion is electrically connected to the other third signal lead segment by means of a fourteenth adaption via hole GZ14.

Illustratively, the thirteenth adaption via hole GZ13 penetrates the gate insulating layer and the interlayer insulating layer. The fourteenth adaption via hole GZ14 penetrates the gate insulating layer and the interlayer insulating layer.

In the embodiment of the present disclosure, as shown in FIGS. 13A-13C, a plurality of fourth bridge connection portions are mutually arranged at intervals. That is, an orthographic projection of the fourth bridge connection portions on the base substrate does not overlap an orthographic projection of the signal lead-in line in the second line set on the base substrate.

In the embodiment of the present disclosure, as shown in FIGS. 13A-13C, a total number of the fourth bridge connection portions corresponding to one signal lead-in line in the first line set is equal to the sum of a total number of the third bridge connection portions and the second bridge connection portions corresponding to one signal lead-in line in the second line set. For example, the signal lead-in line 110-1 corresponds to two fourth bridge connection portions, the signal lead-in line 110-2 corresponds to two fourth bridge connection portions, and the signal lead-in line 110-3 corresponds to two fourth bridge connection portions. The signal lead-in line 120-1 corresponds to one third bridge connection portion and one second bridge connection portion 421, the signal lead-in line 120-2 corresponds to one third bridge connection portion and one second bridge connection portion 422, and the signal lead-in line 120-3 corresponds to one third bridge connection portion and one second bridge connection portion 423.

Illustratively, in the embodiment of the present disclosure, as shown in FIGS. 13A-13C, the signal lead-in line 110-1 includes a first signal lead segment 110-1a and two second signal lead segments 110-1b and 110-1c. A first end of the first signal lead segment 110-1a is electrically connected to the third signal lead-in sub-portion 213 directly, a second end of the first signal lead segment 110-1a is electrically connected to the fourth bridge adaption portion 440-1a by means of a fifth adaption via hole GZ5, the fourth bridge adaption portion 440-1a is electrically connected to a first end of the second signal lead segment 110-1b by means of a sixth adaption via hole GZ6, a second end of the second signal lead segment 110-1b is electrically connected to the fourth bridge adaption portion 440-1b by means of a seventh adaption via hole GZ7, the fourth bridge adaption portion 440-1b is electrically connected to a first end of the second signal lead segment 110-1c by means of an eighth adaption via hole GZ8, and a second end of the second signal lead segment 110-1c is electrically connected to an input signal end IP of the corresponding shift register. A first end of the first signal lead segment 110-2a is electrically connected to the third signal lead-in sub-portion 213 directly, a second end of the first signal lead segment 110-2a is electrically connected to the fourth bridge adaption portion 440-2a by means of a fifth adaption via hole GZ5, the fourth bridge adaption portion 440-2a is electrically connected to a first end of the second signal lead segment 110-2b by means of a sixth adaption via hole GZ6, a second end of the second signal lead segment 110-2b is electrically connected to the fourth bridge adaption portion 440-2b by means of a seventh adaption via hole GZ7, the fourth bridge adaption portion 440-2b is electrically connected to a first end of the second signal lead segment 110-2c by means of an eighth adaption via hole GZ8, and a second end of the second signal lead segment 110-2c is electrically connected to an input signal end IP of the corresponding shift register. A first end of the first signal lead segment 110-3a is electrically connected to the third signal lead-in sub-portion 213 directly, a second end of the first signal lead segment 110-3a is electrically connected to the fourth bridge adaption portion 440-3a by means of a fifth adaption via hole GZ5, the fourth bridge adaption portion 440-3a is electrically connected to a first end of the second signal lead segment 110-3b by means of a sixth adaption via hole GZ6, a second end of the second signal lead segment 110-3b is electrically connected to the fourth bridge adaption portion 440-3b by means of a seventh adaption via hole GZ7, the fourth bridge adaption portion 440-3b is electrically connected to a first end of the second signal lead segment 110-3c by means of an eighth adaption via hole GZ8, and a second end of the second signal lead segment 110-3c is electrically connected to an input signal end IP of the corresponding shift register.

In the embodiment of the present disclosure, as shown in FIGS. 13A-13C, the signal lead-in line 120-1 may include two third signal lead segments 120-1b, 120-1c. A first end of the third signal lead segment 120-1b is electrically connected to the second bridge connection sub-portion 421 by means of a third adaption via hole GZ3, a second end of the third signal lead segment 120-1b is electrically connected to the third bridge connection portion 430-1 by means of a thirteenth adaption via hole GZ13, the third bridge connection portion 430-1 is electrically connected to a first end of the third signal lead segment 120-1c by means of a fourteenth adaption via hole GZ14, and a second end of the third signal lead segment 120-1c is electrically connected to an input signal end IP of the corresponding shift register. The signal lead-in line 120-2 may include two third signal lead segments 120-2b, 120-2c. A first end of the third signal lead segment 120-2b is electrically connected to the second bridge connection sub-portion 422 by means of a third adaption via hole GZ3, a second end of the third signal lead segment 120-2b is electrically connected to the third bridge connection portion 430-2 by means of a thirteenth adaption via hole GZ13, the third bridge connection portion 430-2 is electrically connected to a first end of the third signal lead segment 120-2c by means of a fourteenth adaption via hole GZ14, and a second end of the third signal lead segment 120-2c is electrically connected to an input signal end IP of the corresponding shift register. The signal lead-in line 120-3 may include two third signal lead segments 120-3b, 120-3c. A first end of the third signal lead segment 120-3b is electrically connected to the second bridge connection sub-portion 423 by means of a third adaption via hole GZ3, a second end of the third signal lead segment 120-3b is electrically connected to the third bridge connection portion 430-3 by means of a thirteenth adaption via hole GZ13, the third bridge connection portion 430-3 is electrically connected to a first end of the third signal lead segment 120-3c by means of a fourteenth adaption via hole GZ14, and a second end of the third signal lead segment 120-3c is electrically connected to an input signal end IP of the corresponding shift register.

An embodiment of the present disclosure further provides some other structural schematic diagrams of the display panel, as shown in FIGS. 14A-15B, which are variations of the embodiments above. Herein, only the differences between this embodiment and the above embodiments will be described, and the same part will not be repeated herein.

In the embodiment of the present disclosure, as shown in FIGS. 14A-15B, the display panel further includes: a first auxiliary portion 510 and a second auxiliary portion 520, where the first auxiliary portion 510, the second auxiliary portion 520 and the bridge portion are located at the same layer; and an orthographic projection of the first auxiliary portion 510 on the base substrate is located between orthographic projections of the first signal lead-in sub-portion and the third signal lead-in sub-portion 213 on the base substrate, and the fifth bridge connection portion 450 is electrically connected to the first auxiliary portion 510 by means of a fifteenth adaption via hole GZ15. An orthographic projection of the second auxiliary portion 520 on the base substrate is located between orthographic projections of the second signal lead-in sub-portion and the first bridge portion 310 on the base substrate, and the first bridge connection portion 410 is electrically connected to the second auxiliary portion 520 by means of a sixteenth adaption via hole GZ16.

Illustratively, the fifteenth adaption via hole GZ15 penetrates the interlayer insulating layer, and the sixteenth adaption via hole GZ16 penetrates the interlayer insulating layer.

Illustratively, in the embodiment of the present disclosure, as shown in FIGS. 14A-15B, the first signal lead-in portion 210 may include a first signal lead-in sub-portion 211 and a third signal lead-in sub-portion 213. An orthographic projection of the first auxiliary portion 510 on the base substrate is located between orthographic projections of the first signal lead-in sub-portion 211 and the third signal lead-in sub-portion 213 on the base substrate. The fifth bridge connection portion 450 is electrically connected to the first auxiliary portion 510 by means of a fifteenth adaption via hole GZ15.

Illustratively, in the embodiment of the present disclosure, as shown in FIGS. 14A-15B, the second signal lead-in portion 200 may include a second signal lead-in sub-portion 221. An orthographic projection of the second auxiliary portion 520 on the base substrate is located between orthographic projections of the second signal lead-in sub-portion 221 and the first bridge portion 310 on the base substrate. The first bridge connection portion 410 is electrically connected to the second auxiliary portion 520 by means of a sixteenth adaption via hole GZ16.

In the embodiment of the present disclosure, in order to reduce a difference between a resistance of a flow path of the signal stv_a and a resistance of a flow path of the signal stv_b as much as possible, a fifth bridge connection portion 450 configured to electrically connect the first signal lead-in sub-portion 211 and the third signal lead-in sub-portion 213 is arranged, so as to increase the resistance of the flow path of the signal stv_a. However, resistance increase makes signal delay increase, and in order to reduce the delay of the signals stv_a and stv_b, the first auxiliary portion 510 electrically connected to the first signal lead-in portion 210 is arranged, so as to reduce the resistance of the flow path of the signal stv_a, and the second auxiliary portion 520 electrically connected to the second signal lead-in sub-portion is arranged, so as to reduce the resistance of the flow path of the signal stv_b.

Illustratively, in the embodiment of the present disclosure, as shown in FIGS. 14A-15B, a total number of the fifteenth adaption via hole GZ15 may be equal to a total number of the sixteenth adaption via hole GZ16. For example, the total number of the fifteenth adaption via hole GZ15 and the total number of the sixteenth adaption via hole GZ16 may be 16, 20, 24 or other numbers, may be designed according to the requirements of practical applications, and are not limited herein. Certainly, the total number of the fifteenth adaption via hole GZ15 and the total number of the sixteenth adaption via hole GZ16 may also be different. In practical applications, the total number of the fifteenth adaption via hole GZ15 and the total number of the sixteenth adaption via hole GZ16 may be designed according to the requirements of practical applications, and are not limited herein.

Figure 14A:
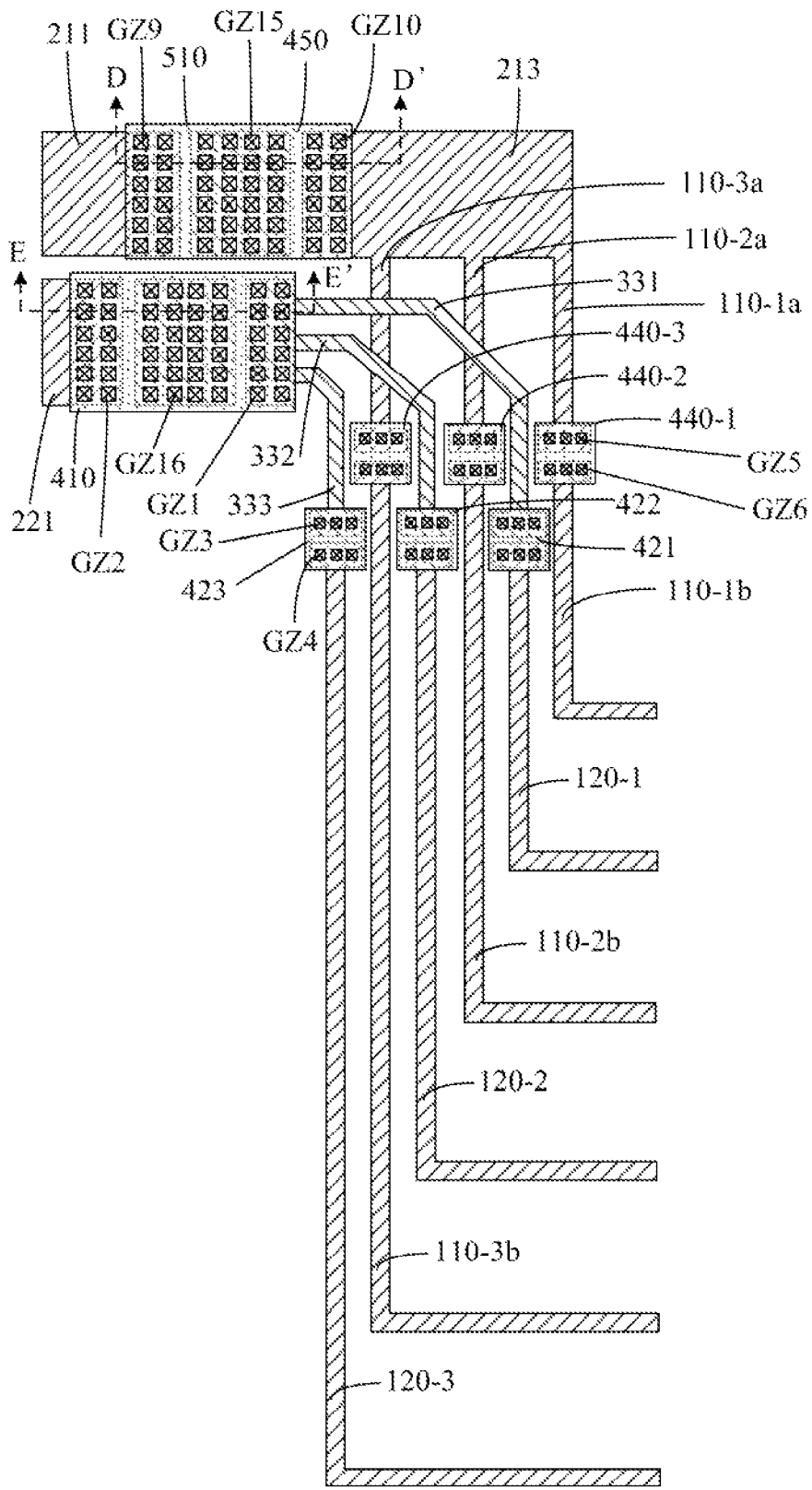
FIG. 14A is a schematic diagram of some other layout structures of a display panel in an embodiment of the present disclosure.
Figure 14B:
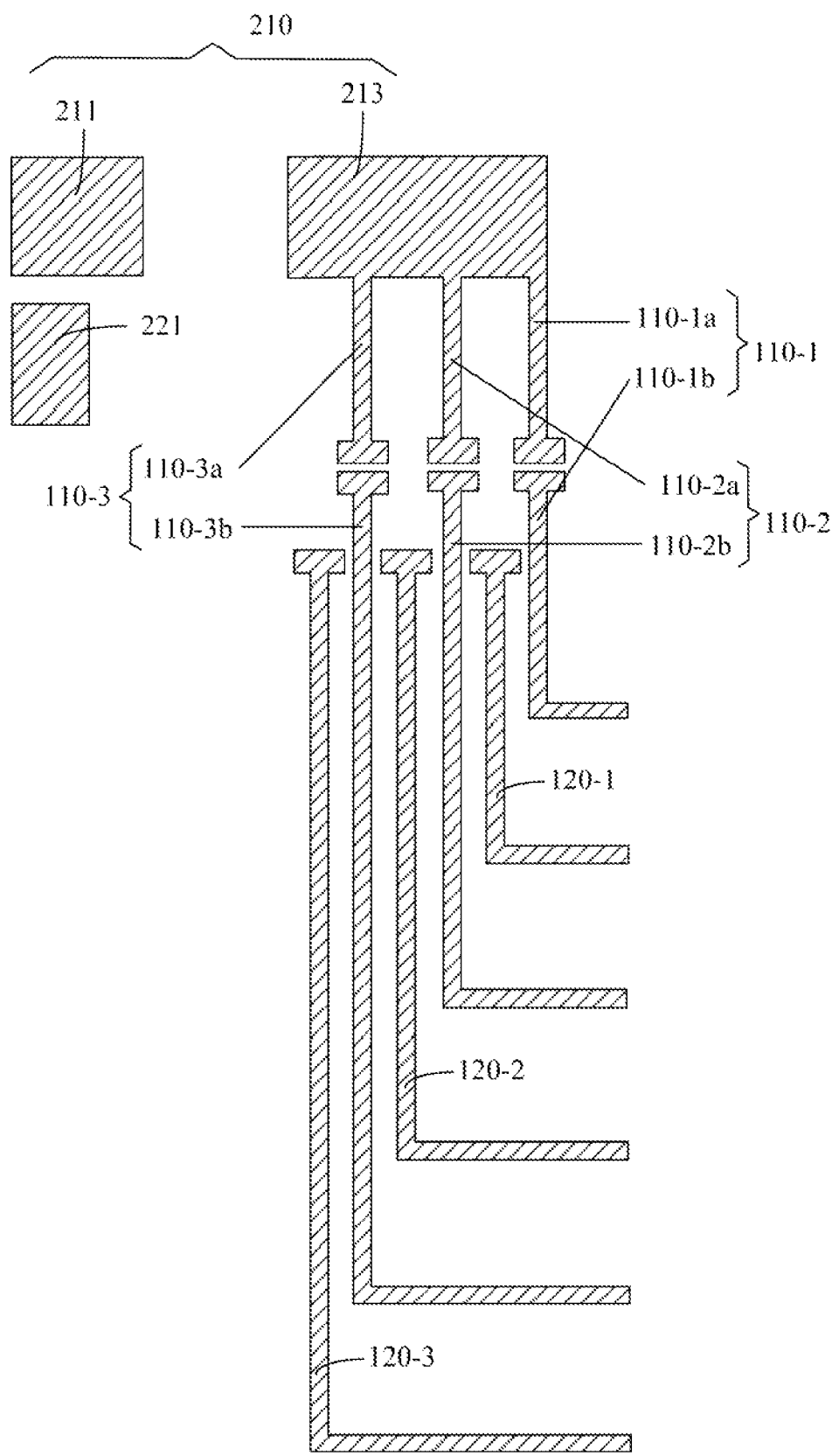
FIG. 14B is a schematic diagram of a layout structure of a layer where a signal lead-in line in FIG. 14A is located.
Figure 14C:
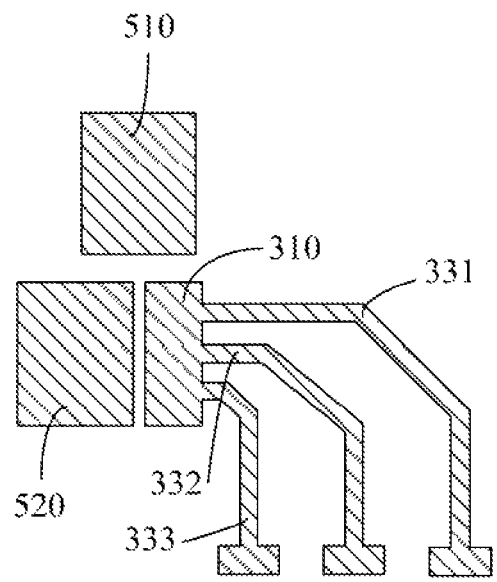
FIG. 14C is a schematic diagram of a layout structure of a layer where a bridge portion in FIG. 14A is located.
Figure 14D:
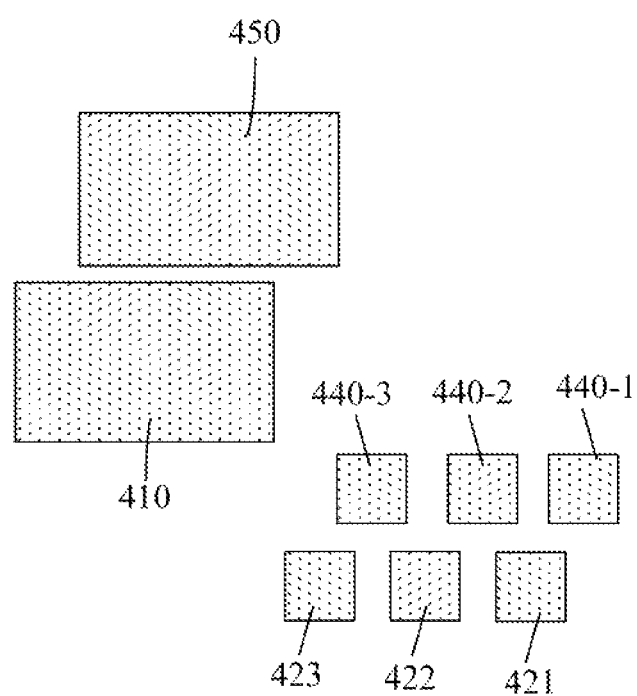
FIG. 14D is a schematic diagram of a layout structure of a layer where a first bridge connection portion in FIG. 14A is located.
Figure 15A:
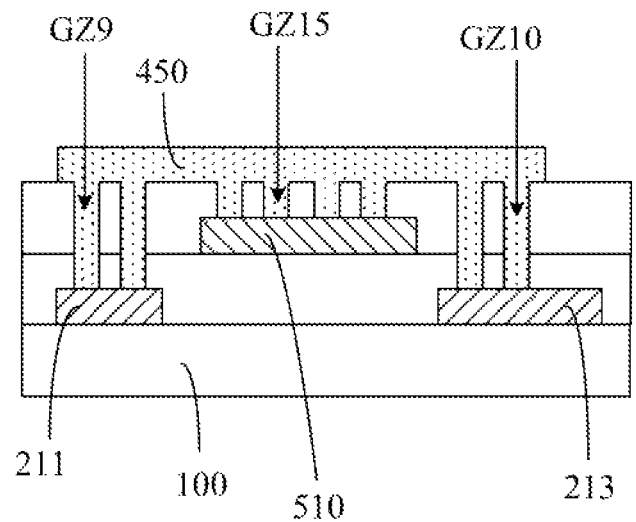
FIG. 15A is a schematic sectional view in direction DD' in FIG. 14A.
Figure 15B:
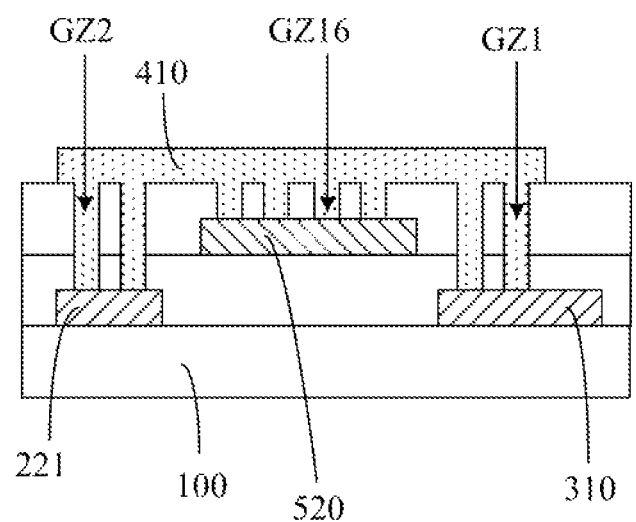
FIG. 15B is a schematic sectional view in direction EE' in FIG. 14A.
Figure 16:
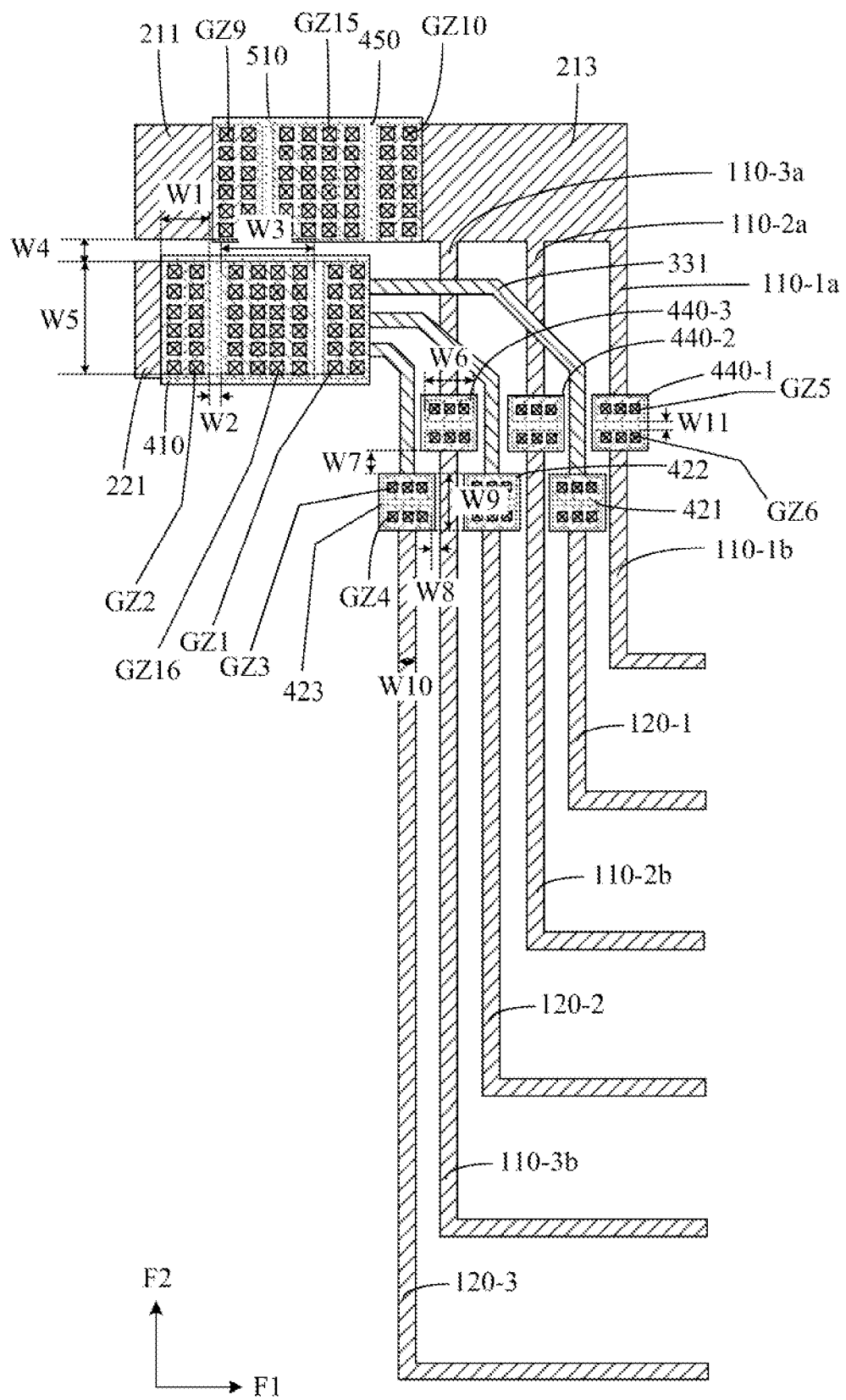
FIG. 16 is a schematic diagram of some other layout structures of a display panel in an embodiment of the present disclosure.

Illustratively, in the embodiment of the present disclosure, as shown in FIGS. 14A and 16, the first adaption via hole GZ1, the second adaption via hole GZ2, the ninth adaption via hole GZ9, the tenth adaption via hole GZ10, the fifteenth adaption via hole GZ15 and the sixteenth adaption via hole GZ16 may have an identical size. The first adaption via hole GZ1, the second adaption via hole GZ2, the ninth adaption via hole GZ9, the tenth adaption via hole GZ10, the fifteenth adaption via hole GZ15 and the sixteenth adaption via hole GZ16 may have an identical shape. Certainly, in practical applications, the first adaption via hole GZ1, the second adaption via hole GZ2, the ninth adaption via hole GZ9, the tenth adaption via hole GZ10, the fifteenth adaption via hole GZ15 and the sixteenth adaption via hole GZ16 may have sizes and shapes which are designed according to the requirements of practical applications and are not limited herein.

Illustratively, in the embodiment of the present disclosure, as shown in FIGS. 14A and 16, the third adaption via hole GZ3, the fourth adaption via hole GZ4, the fifth adaption via hole GZ5, and the sixth adaption via hole GZ6 may have an identical size. The third adaption via hole GZ3, the fourth adaption via hole GZ4, the fifth adaption via hole GZ5, and the sixth adaption via hole GZ6 may have an identical shape. Certainly, in practical applications, the third adaption via hole GZ3, the fourth adaption via hole GZ4, the fifth adaption via hole GZ5, and the sixth adaption via hole GZ6 may have sizes and shapes which are designed according to the requirements of practical applications and are not limited herein.

Illustratively, in the embodiment of the present disclosure, as shown in FIGS. 14A and 16, the first adaption via hole GZ1, the second adaption via hole GZ2, the ninth adaption via hole GZ9, the tenth adaption via hole GZ10, the fifteenth adaption via hole GZ15 and the sixteenth adaption via hole GZ16 may have a size larger than that of the third adaption via hole GZ3, the fourth adaption via hole GZ4, the fifth adaption via hole GZ5, and the sixth adaption via hole GZ6.

Illustratively, in the embodiment of the present disclosure, as shown in FIGS. 14A and 16, the first adaption via hole GZ1, the second adaption via hole GZ2, the ninth adaption via hole GZ9, the tenth adaption via hole GZ10, the fifteenth adaption via hole GZ15 and the sixteenth adaption via hole GZ16 may have a shape identical to that of the third adaption via hole GZ3, the fourth adaption via hole GZ4, the fifth adaption via hole GZ5, and the sixth adaption via hole GZ6.

Illustratively, in the embodiment of the present disclosure, as shown in FIGS. 14A and 16, a distance W1 between one side, away from the bridge portion, of the first bridge connection portion 410 and one side, close to the bridge portion, of the second signal lead-in sub-portion in direction F1 may be set to be 30 μm-50 μm. Illustratively, W1 may be set to be 30 μm. Alternatively, W1 may also be set to be 35 μm. Alternatively, W1 may also be set to be 40 μm. Alternatively, W1 may also be set to be 45 μm. Alternatively, W1 may also be set to be 50 μm. In practical applications, a specific value of W1 may be designed according to requirements of practical applications and is not limited herein.

Illustratively, in the embodiment of the present disclosure, as shown in FIGS. 14a and 16, a distance W2 between one side, close to the bridge portion, of the second signal lead-in sub-portion and one side, close to the second signal lead-in sub-portion, of the second auxiliary portion 520 in direction F1 may be set to be 4 μm-10 μm. Illustratively, W2 may be set to be 4 μm. Alternatively, W2 may also be set to be 5 μm. Alternatively, W2 may also be set to be 6 μm. Alternatively, W2 may also be set to be 7 μm. Alternatively, W2 may also be set to be 8 μm. Alternatively, W2 may also be set to be 9 μm. Alternatively, W2 may also be set to be 10 μm. In practical applications, a specific value of W2 may be designed according to requirements of practical applications and is not limited herein.

Illustratively, in the embodiment of the present disclosure, as shown in FIGS. 14A and 16, a distance W3 between one side, close to the second signal lead-in sub-portion, of the second auxiliary portion 520 and one side, away from the second signal lead-in sub-portion, of the second auxiliary portion 520 in direction F1 may be set to be 60 μm-100 μm. Illustratively, W3 may be set to be 60 μm. Alternatively, W3 may also be set to be 70 μm. Alternatively, W3 may also be set to be 80 μm. Alternatively, W3 may also be set to be 90 μm. Alternatively, W3 may also be set to be 100 μm. In practical applications, a specific value of W3 may be designed according to requirements of practical applications and is not limited herein.

Illustratively, in the embodiment of the present disclosure, as shown in FIGS. 14A and 16, the first auxiliary portion 510 overlaps the bridge portion in direction F2, and a distance W4 between the first auxiliary portion 510 and the bridge portion in direction F2 may be set to be 40 μm-80 μm. Illustratively, W4 may be set to be 40 μm. Alternatively, W4 may also be set to be 50 μm. Alternatively, W4 may also be set to be 60 μm. Alternatively, W4 may also be set to be 70 μm. Alternatively, W4 may also be set to be 80 μm. In practical applications, a specific value of W4 may be designed according to requirements of practical applications and is not limited herein.

Illustratively, in the embodiment of the present disclosure, as shown in FIGS. 14A and 16, a distance W5 of the first bridge portion 310 in direction F2 may be set to be 50 μm-150 μm. Illustratively, W5 may be set to be 50 μm. Alternatively, W5 may also be set to be 70 μm. Alternatively, W5 may also be set to be 90 μm. Alternatively, W5 may also be set to be 110 μm. Alternatively, W5 may also be set to be 130 μm. Alternatively, W5 may also be set to be 150 μm. In practical applications, a specific value of W5 may be designed according to requirements of practical applications and is not limited herein.

Illustratively, in the embodiment of the present disclosure, as shown in FIGS. 14A and 16, a distance W6 of an area, provided with the fifth adaption via hole GZ5, of the signal lead-in line in the first line set in direction F1 may be set to be 20 μm-80 μm. Illustratively, W6 may be set to be 20 μm. Alternatively, W6 may also be set to be 30 μm. Alternatively, W6 may also be set to be 40 μm. Alternatively, W6 may also be set to be 50 μm. Alternatively, W6 may also be set to be 60 μm. Alternatively, W6 may also be set to be 70 μm. Alternatively, W6 may also be set to be 80 μm. In practical applications, a specific value of W6 may be designed according to requirements of practical applications and is not limited herein.

Illustratively, in the embodiment of the present disclosure, as shown in FIGS. 14A and 16, a distance of an area, provided with the sixth adaption via hole GZ6, of the signal lead-in line in the first line set in direction F1 may also be W6 and is not repeated herein.

Illustratively, in the embodiment of the present disclosure, as shown in FIGS. 14A and 16, a distance W7 between a straight where one side, close to the second bridge connection portion 420, of the fourth bridge connection portion is located and a straight where one side, close to the fourth bridge connection portion, of the second bridge connection portion 420 in direction F2 may be set to be 4 μm-10 μm. Illustratively, W7 may be set to be 4 μm. Alternatively, W7 may also be set to be 5 μm. Alternatively, W7 may also be set to be 6 μm. Alternatively, W7 may also be set to be 7 μm. Alternatively, W7 may also be set to be 8 μm. Alternatively, W7 may also be set to be 9 μm. Alternatively, W7 may also be set to be 10 μm. In practical applications, a specific value of W7 may be designed according to requirements of practical applications and is not limited herein.

Illustratively, in the embodiment of the present disclosure, as shown in FIGS. 14A and 16, a distance W8 between the second bridge connection portion 420 and an adjacent signal lead-in line in direction F1 may be set to be 4 μm-10 μm. Illustratively, W8 may be set to be 4 μm. Alternatively, W8 may also be set to be 5 μm. Alternatively, W8 may also be set to be 6 μm. Alternatively, W8 may also be set to be 7 μm. Alternatively, W8 may also be set to be 8 μm. Alternatively, W8 may also be set to be 9 μm. Alternatively, W8 may also be set to be 10 μm. In practical applications, a specific value of W8 may be designed according to requirements of practical applications and is not limited herein.

Illustratively, in the embodiment of the present disclosure, as shown in FIGS. 14A and 16, a distance between the fourth bridge connection portion and an adjacent signal lead-in line in direction F1 may be W8 and is not repeated herein.

Illustratively, in the embodiment of the present disclosure, as shown in FIGS. 14A and 16, a distance W9 of the second bridge connection portion 420 in direction F2 may be set to be 4 μm-10 μm. Illustratively, W9 may be set to be 4 μm. Alternatively, W9 may also be set to be 5 μm. Alternatively, W9 may also be set to be 6 μm. Alternatively, W9 may also be set to be 7 μm. Alternatively, W9 may also be set to be 8 μm. Alternatively, W9 may also be set to be 9 μm. Alternatively, W9 may also be set to be 10 μm. In practical applications, a specific value of W9 may be designed according to requirements of practical applications and is not limited herein.

Illustratively, in the embodiment of the present disclosure, as shown in FIGS. 14A and 16, a distance of the fourth bridge connection portion in direction F2 may be W9 and is not repeated herein.

Illustratively, in the embodiment of the present disclosure, as shown in FIGS. 14A and 16, a distance W10 of an area, provided with no adaption via hole, of each signal lead-in line in the second line set in direction F1 may be set to be 4 μm-10 μm. Illustratively, W10 may be set to be 4 μm. Alternatively, W10 may also be set to be 5 μm. Alternatively, W10 may also be set to be 6 μm. Alternatively, W10 may also be set to be 7 μm. Alternatively, W10 may also be set to be 8 μm. Alternatively, W10 may also be set to be 9 μm. Alternatively, W10 may also be set to be 10 μm. In practical applications, a specific value of W10 may be designed according to requirements of practical applications and is not limited herein.

Illustratively, in the embodiment of the present disclosure, as shown in FIGS. 14A and 16, a distance of an area, provided with no adaption via hole, of each signal lead-in line in the first line set in direction F1 may also be W10 and is not repeated herein.

Illustratively, in the embodiment of the present disclosure, as shown in FIGS. 14A and 16, a distance W11 between the first signal lead segment (for example, 110-1a) and the second signal lead segment (for example, 110-1a) which are connected to one fourth bridge adaption portion in direction F2 may be set to be 4 μm-10 μm. Illustratively, W11 may be set to be 4 μm. Alternatively, W11 may also be set to be 5 μm. Alternatively, W11 may also be set to be 6 μm. Alternatively, W11 may also be set to be 7 μm. Alternatively, W11 may also be set to be 8 μm. Alternatively, W11 may also be set to be 9 μm. Alternatively, W11 may also be set to be 10 μm. In practical applications, a specific value of W11 may be designed according to requirements of practical applications and is not limited herein.

Illustratively, in the embodiment of the present disclosure, as shown in FIGS. 14A and 16, a distance between the third bridge sub-portion (for example, 421) and the signal lead-in line (for example, 120-1) which are connected to one second bridge adaption portion in direction F2 may also be W11 and is not repeated herein.

An embodiment of the present disclosure further provides some other structural schematic diagrams of the display panel, as shown in FIGS. 17A-17D, which are variations of the embodiments above. Herein, only the differences between this embodiment and the above embodiments will be described, and the same part will not be repeated herein.

Figure 17A:
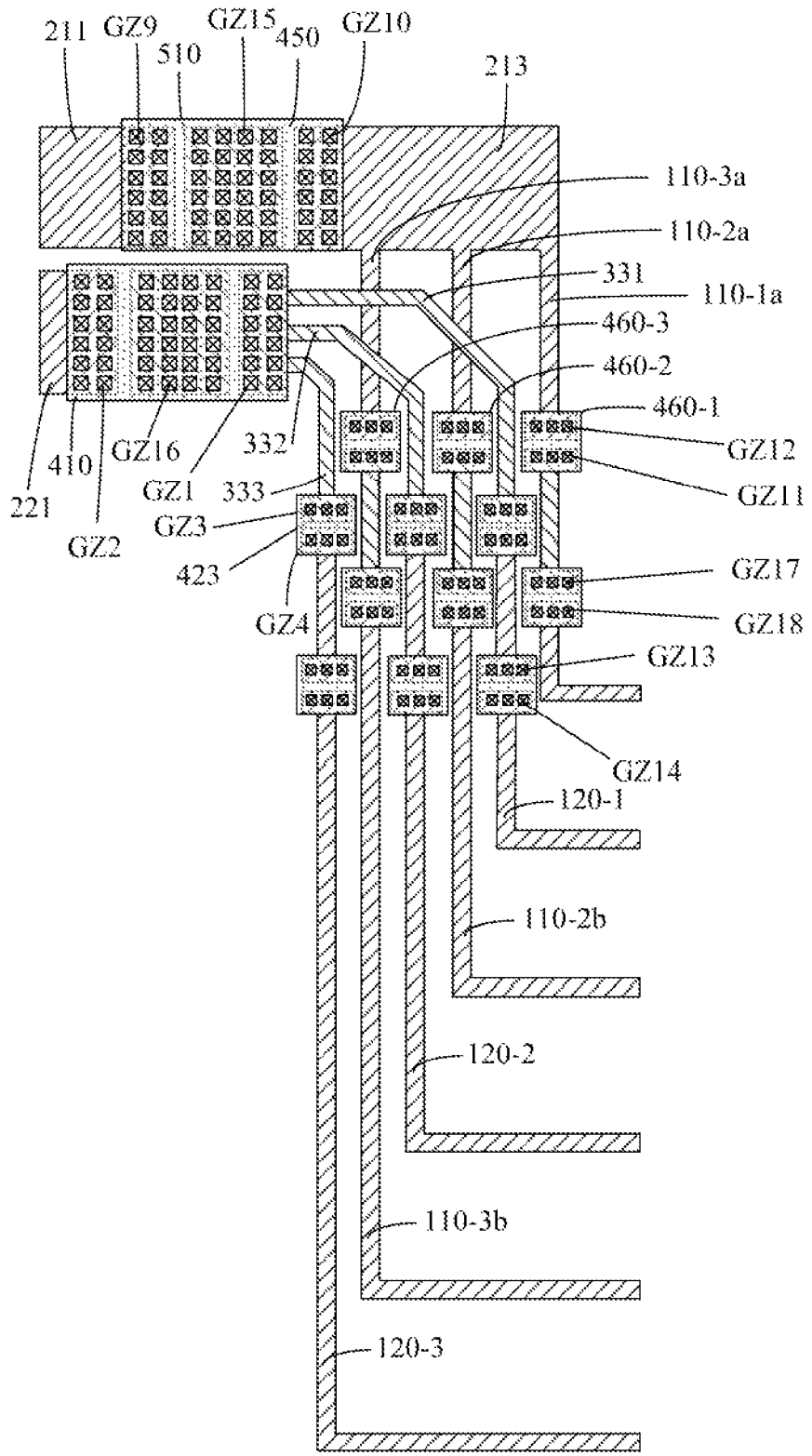
FIG. 17A is a schematic diagram of some other layout structures of a display panel in an embodiment of the present disclosure.
Figure 17B:
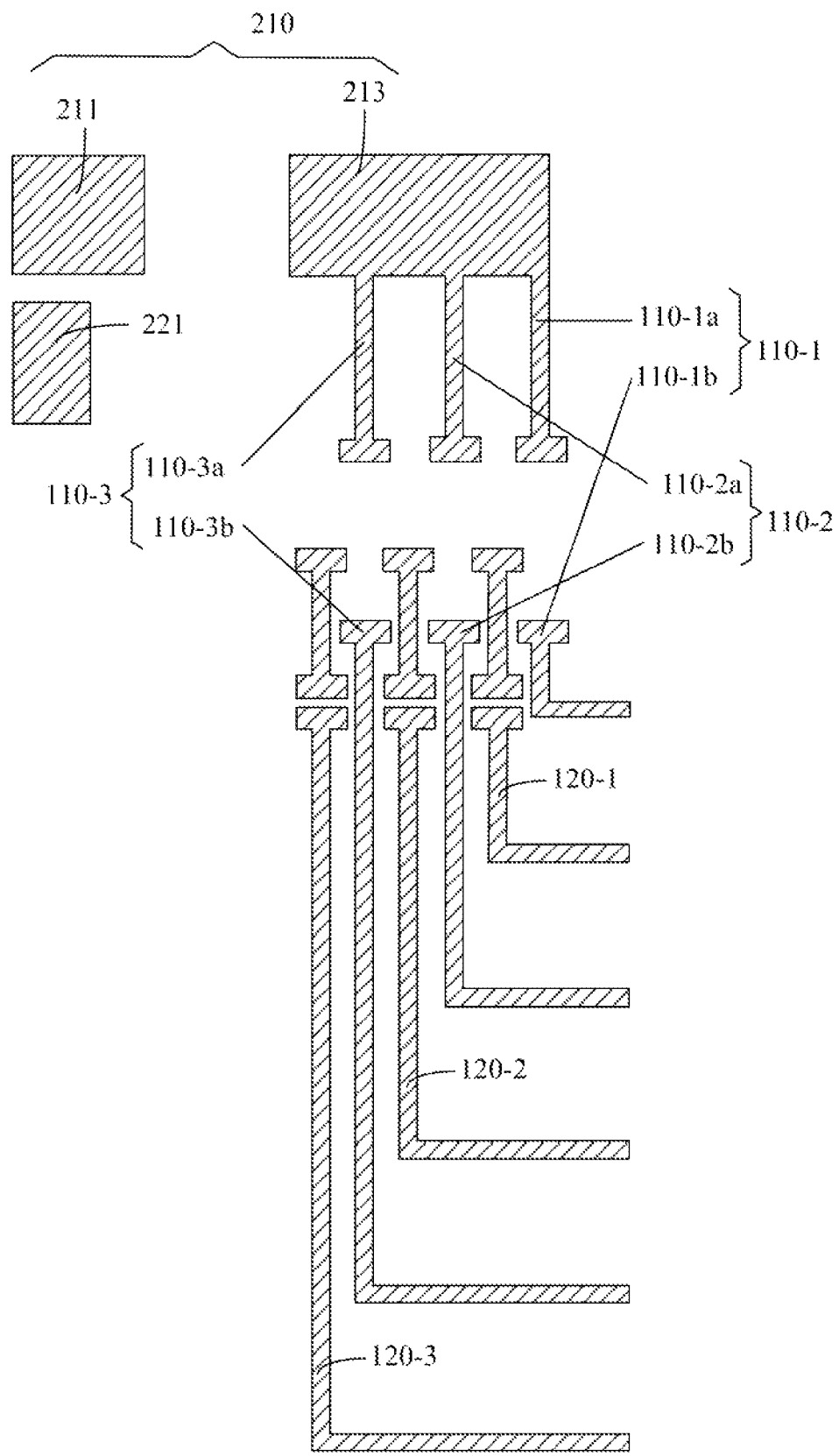
FIG. 17B is a schematic diagram of a layout structure of a layer where a signal lead-in line in FIG. 17A is located.
Figure 17C:
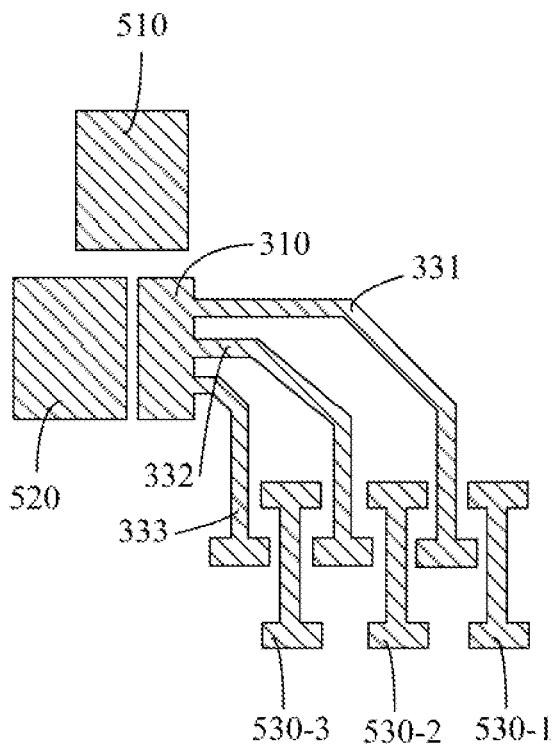
FIG. 17C is a schematic diagram of a layout structure of a layer where a bridge portion in FIG. 17A is located.
Figure 17D:
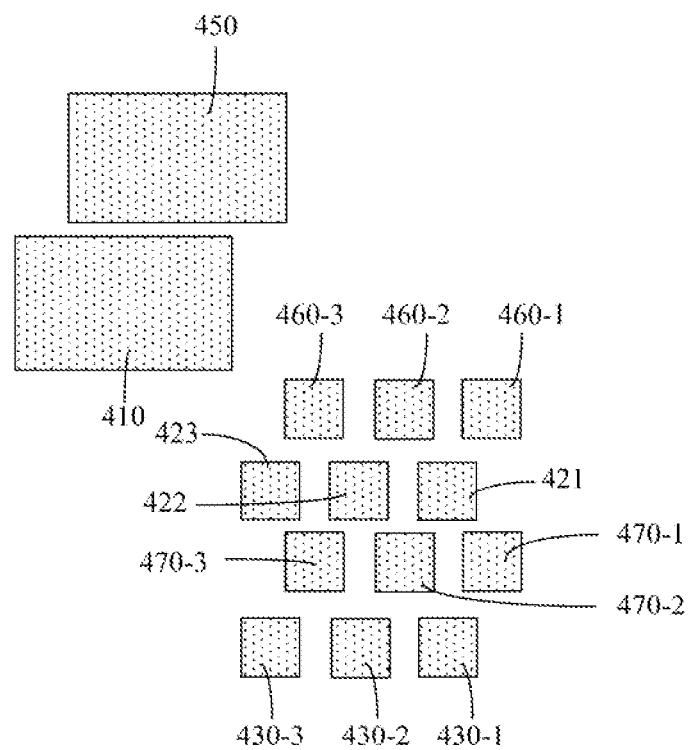
FIG. 17D is a schematic diagram of a layout structure of a layer where a first bridge connection portion in FIG. 17A is located.

In the embodiment of the present disclosure, as shown in FIGS. 17A and 17D, the display panel may further include: a plurality of third auxiliary portions (for example, 530-1, 530-2, 530-3), where the third auxiliary portions, the first auxiliary portion 510 and the bridge portion are located at the same layer; one signal lead-in line in the first line set is correspondingly provided with at least one third auxiliary portion; and in one signal lead-in line, the first signal lead segment is electrically connected to the second signal lead segment by means of the corresponding third auxiliary portion. Illustratively, the display panel further includes: a plurality of sixth bridge adaption portions and a plurality of seventh bridge adaption portions, where at least one third auxiliary portion is correspondingly provided with at least one sixth bridge adaption portion and at least one seventh bridge adaption portion; and a first end of the third auxiliary portion is electrically connected to the corresponding sixth bridge adaption portion by means of an eleventh adaption via hole GZ11, the sixth bridge adaption portion is electrically connected to the corresponding first signal lead segment by means of a twelfth adaption via hole GZ12, a second end of the third auxiliary portion is electrically connected to the corresponding seventh bridge adaption portion by means of a seventeenth adaption via hole GZ17, and the seventh bridge adaption portion is electrically connected to the corresponding seventh bridge adaption portion by means of an eighteenth adaption via hole GZ18.

Illustratively, the eleventh adaption via hole GZ11 penetrates the interlayer insulating layer. The twelfth adaption via hole GZ12 penetrates the gate insulating layer and the interlayer insulating layer. The seventeenth adaption via hole GZ17 penetrates the interlayer insulating layer. The eighteenth adaption via hole GZ18 penetrates the gate insulating layer and the interlayer insulating layer.

Illustratively, as shown in FIGS. 17A-17D, the signal lead-in line 110-1 is correspondingly provided with a third auxiliary portion 530-1, a sixth bridge adaption portion 460-1 and a seventh bridge adaption portion 470-1. The first signal lead segment 110-1a is electrically connected to the sixth bridge adaption portion 460-1 by means of a twelfth adaption via hole GZ12, and the sixth bridge adaption portion 460-1 is electrically connected to a first end of the third auxiliary portion 530-1 by means of an eleventh adaption via hole GZ11. A second end of the third auxiliary portion 530-1 is electrically connected to the seventh bridge adaption portion 470-1 by means of a seventeenth adaption via hole GZ17, and the seventh bridge adaption portion 470-1 is electrically connected to the second signal lead segment 110-1b by means of an eighteenth adaption via hole GZ18. In this way, a difference between a resistance of the signal lead-in line in the first line set and a resistance of the signal lead-in line in the second line set may be further reduced. The remaining parts are the same as above and will not be repeated herein.

Figure 18A:
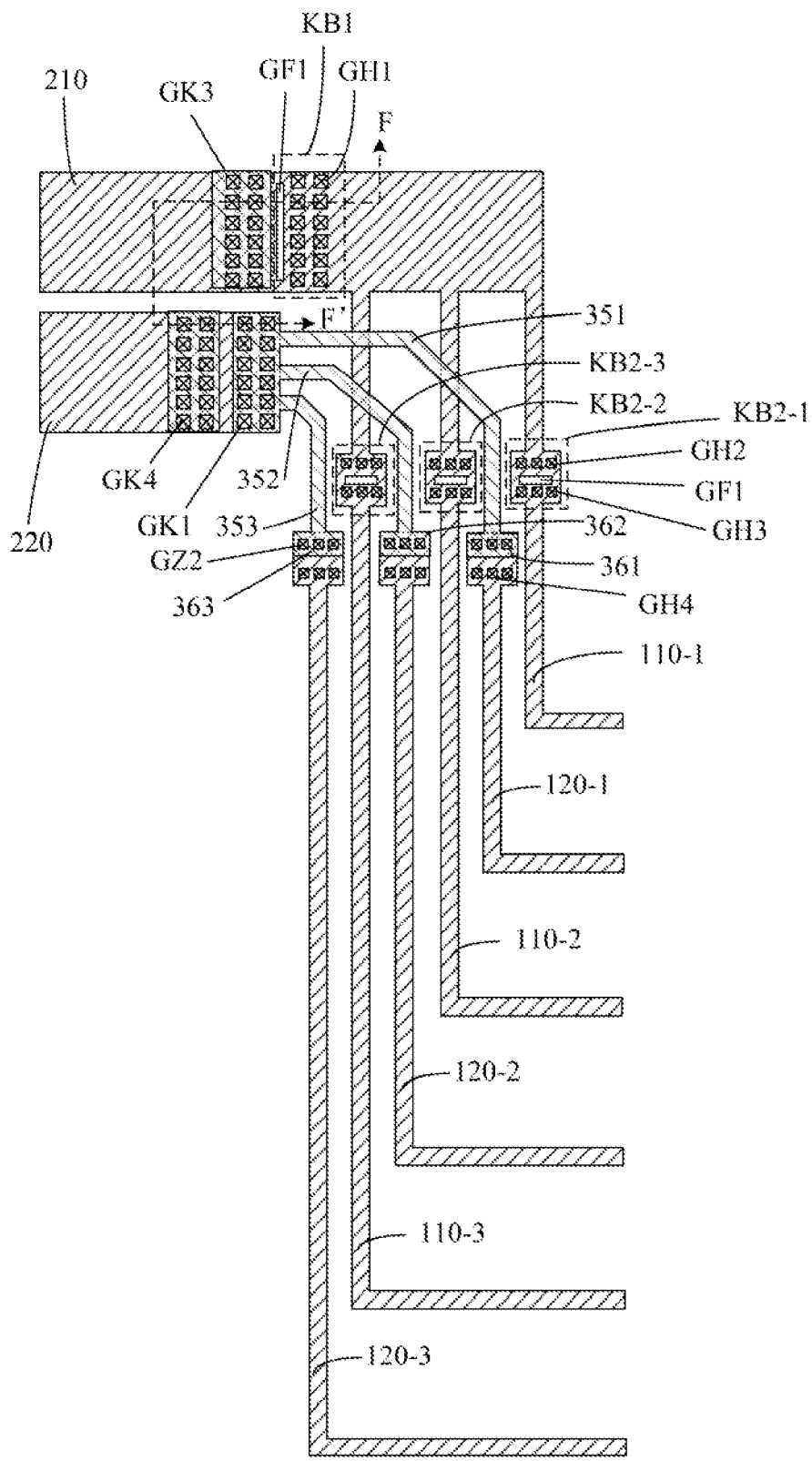
FIG. 18A is a schematic diagram of some other layout structures of a display panel in an embodiment of the present disclosure.
Figure 18B:
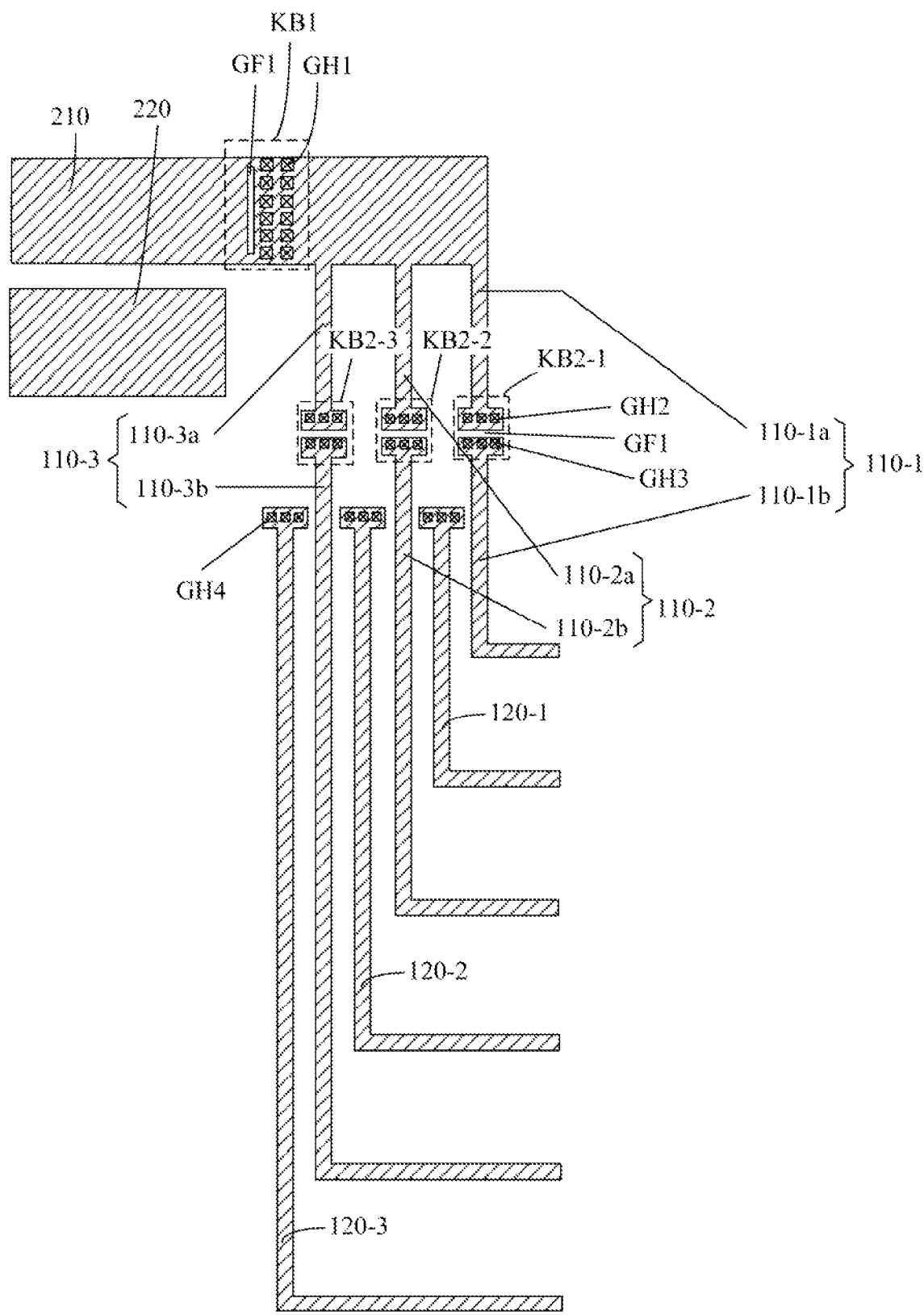
FIG. 18B is a schematic diagram of a layout structure of a layer where a signal lead-in line in FIG. 18A is located.
Figure 18C:
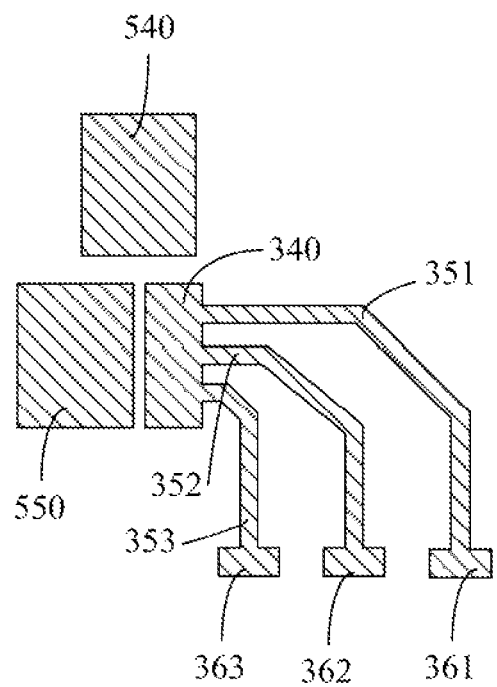
FIG. 18C is a schematic diagram of a layout structure of a layer where a bridge portion in FIG. 18A is located.
Figure 19:
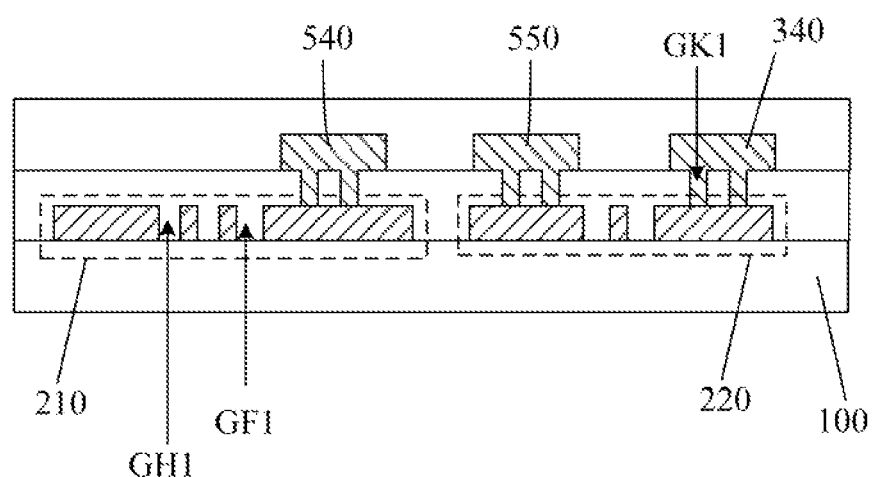
FIG. 19 is a schematic sectional view in direction FF' in FIG. 18A.

An embodiment of the present disclosure further provides some other structural schematic diagrams of the display panel, as shown in FIGS. 18A-19, which are variations of the embodiments above. Herein, only the differences between this embodiment and the above embodiments will be described, and the same part will not be repeated herein.

In the embodiment of the present disclosure, as shown in FIGS. 18A-19, the bridge portion may include a fourth bridge portion 340, a sixth bridge portion, and a fifth bridge portion connected between the fourth bridge portion 340 and the sixth bridge portion; the fourth bridge portion 340 is electrically connected to the second signal lead-in portion 220 by means of a first conduction via hole GK1; and the sixth bridge portion is electrically connected to the signal lead-in line in the second line set by means of a second conduction via hole GK2. Illustratively, the fifth bridge portion includes a plurality of fifth bridge sub-portions (for example, 351, 352, 353) mutually arranged at intervals, the sixth bridge portion includes a plurality of sixth bridge sub-portions (for example, 361, 362, 363) mutually arranged at intervals, and the fourth bridge portion 340 is electrically connected to one signal lead-in line in the second line set by means of at least one fifth bridge sub-portion and at least one sixth bridge sub-portion.

Illustratively, the second signal lead-in portion 220 is electrically connected to the fourth bridge portion 340 by means of a first conduction via hole GK1, the sixth bridge sub-portion 361 is electrically connected to the fifth bridge sub-portion 351 directly, and the fifth bridge sub-portion 351 is electrically connected to the signal lead-in line 120-1 by means of a second conduction via hole GK2. The sixth bridge sub-portion 362 is electrically connected to the fifth bridge sub-portion 352 directly, and the fifth bridge sub-portion 352 is electrically connected to the signal lead-in line 120-2 by means of a second conduction via hole GK2. The sixth bridge sub-portion 363 is electrically connected to the fifth bridge sub-portion 353 directly, and the fifth bridge sub-portion 353 is electrically connected to the signal lead-in line 120-3 by means of a second conduction via hole GK2.

In the embodiment of the present disclosure, as shown in FIGS. 18a-19, the first signal lead-in portion 210 includes a first hollow area KB1, the first hollow area KB1 includes a first bonding via hole GH1 and a first bonding slit GF1, and the first bonding via hole GH1 and the first bonding slit GF1 penetrate the first signal lead-in portion 210.

Since the second signal lead-in portion 220 may be electrically connected to the signal lead-in line in the second line set only by means of a bridge portion, a resistance difference between a signal flow path, from the second signal lead-in portion 220 to the signal lead-in line in the second line set, corresponding to stv_b and a signal flow path, from the first signal lead-in portion 210 to the signal lead-in line in the first line set, corresponding to stv_a is large, resulting in a difference in the delay when the signals stv_a and stv_b are input into the signal input end IP, and then signals output by the output signal ends GO of the 1st-stage shift register, the 3rd-stage shift register and the 5th-stage shift register, and the 2nd-stage shift register, the 4th-stage shift register and the 6th-stage shift register have differences, resulting in different brightnesses of the corresponding sub-pixels, and affecting a display effect. In the embodiment of the present disclosure, the first hollow area KB1 is provided in the first signal lead-in portion 210, the first hollow area KB1 is provided with the first bonding via hole GH1 and the first bonding slit GF1 penetrating the second signal lead-in portion 220, in this way, the resistance of the first signal lead-in portion 210 may be increased, and then a voltage difference between a flow path of the signal stv_a and a flow path of the signal stv_b may be reduced, so as to reduce a difference in delay when the signals stv_a and stv_b are input into the signal input end IP, and further to improve the display effect.

In the embodiment of the present disclosure, a total number of the first bonding via hole GH1 may be equal to a total number of the first conduction via hole GK1. For example, the total number of first bonding via holes GH1 and the total number of first conduction via holes GK1 may both be 12, 8 or other numbers, and are not limited herein. Certainly, the total number of the first bonding via hole GH1 and the total number of the first conduction via hole GK1 may be different, may be designed according to the requirements of practical applications, and are not limited herein.

In the embodiment of the present disclosure, as shown in FIGS. 18A-19, the display panel may further include: a fourth auxiliary portion 540 and a fifth auxiliary portion 550, where the fourth auxiliary portion 540, the fifth auxiliary portion 550 and the bridge portion are located at the same layer; the fourth auxiliary portion 540 is electrically connected to the first signal lead-in portion 210 by means of a third conduction via hole GK3; and the fifth auxiliary portion 550 is electrically connected to the second signal lead-in portion 220 by means of a fourth conduction via hole GK4. The fourth auxiliary portion 540 electrically connected to the first signal lead-in portion 210 is arranged, so as to reduce the resistance of the flow path of the signal stv_a. The fifth auxiliary portion 550 electrically connected to the second signal lead-in portion 220 is arranged, so as to reduce the resistance of the flow path of the signal stv_b.

In the embodiment of the present disclosure, as shown in FIGS. 18A-19, the signal lead-in line in the first line set may include a second hollow area (for example, KB-1, KB-2, KB-3), the second hollow area includes a second bonding via hole GH2 and a second bonding slit GF2, the second bonding via hole GH2 penetrates the signal lead-in line in the first line set, and the second bonding slit GF2 penetrates the signal lead-in line in the first line set. In this way, the resistance of the signal lead-in line in the first line set is increased, so as to reduce a difference between a resistance of a flow path of the signal stv_a and a resistance of a flow path of the signal stv_b.

In the embodiment of the present disclosure, as shown in FIGS. 18A-19, the second hollow area (for example, KB-1, KB-2, KB-3) further includes a second bonding via hole GH2, the second bonding via hole GH2 penetrates the signal lead-in line in the first line set, and the second bonding via hole GH2 is located at one side, away from the first bonding via hole GH1, of the second bonding slit GF2; and one end, connected to the fifth bridge sub-portion, of the second signal lead-in line in the second line set is provided with a fourth bonding via hole GH4, and the fourth bonding via hole GH4 is located at one side, away from the sixth bridge sub-portion, of the second conduction via hole GK2. A difference between a resistance of a flow path of the signal stv_a and a resistance of a flow path of the signal stv_b is reduced.

It should be noted that in a practical process, due to limitations of process conditions or other factors, the same in the above embodiments are not completely identical, and some deviations may be made, so long as the above conditions are substantially satisfied, the same relation is within the scope of protection of the present disclosure. For example, the same described above may be the same allowed within an allowable range of error.

While the preferred embodiments of the present disclosure have been described, additional alterations and modifications to those embodiments may be made by those skilled in the art once the basic inventive concept is apparent to those skilled in the art. Therefore, it is intended that the appended claims are to be interpreted to include the preferred embodiments and all alterations and modifications that fall within the scope of the present disclosure.

It will be apparent to those skilled in the art that various modifications and variations can be made to the embodiments of the present disclosure without departing from the spirit and scope of the embodiments of the present disclosure. Thus, it is intended that the disclosure encompass such modifications and variations that fall within the scope of the appended claims and their equivalents as well.

What is claimed is:

1. A display panel, comprising:
a base substrate comprising a non-display area;
a gate drive circuit located in the non-display area, wherein the gate drive circuit comprises a plurality of shift registers, and the plurality of shift registers are divided into a plurality of register sets;

a plurality of signal lead-in lines located in the non-display area, wherein the plurality of signal lead-in lines are divided into a plurality of line sets, and a frame start signal end of one register set is correspondingly and electrically connected to one line set;
and wherein a signal lead-in line of another line set is arranged between two signal lead-in lines of one line set;
a plurality of signal lead-in portions, wherein one of the plurality of line sets is electrically connected to one of the plurality of signal lead-in portions; and
a plurality of bridge portions, wherein the bridge portions and the signal lead-in portions are located at different layers;
wherein the signal lead-in portions and the signal lead-in lines are located at a same layer; and one of the plurality of line sets is electrically connected to a corresponding signal lead-in portion directly, and the remaining line sets are electrically connected to corresponding signal lead-in portions by means of the bridge portions.

2. The display panel according to claim 1, wherein the plurality of register sets comprise a first register set and a second register set;
the plurality of line sets comprise a first line set and a second line set;
the plurality of signal lead-in portions comprise a first signal lead-in portion and a second signal lead-in portion;
a first end of the first line set is electrically connected to the first signal lead-in portion directly, and a second end of the first line set is electrically connected to a frame start signal end of the first register set; and
a first end of the second line set is electrically connected to the second signal lead-in portion by means of a bridge portion, and a second end of the second line set is electrically connected to a frame start signal end of the second register set.

3. The display panel according to claim 2, wherein the bridge portions comprise a first bridge portion, a second bridge portion, and a third bridge portion connected between the first bridge portion and the second bridge portion; and the display panel further comprises:
a first bridge connection portion, wherein the first bridge connection portion, the bridge portions and the signal lead-in portions are located at different layers, a first end of the first bridge connection portion is electrically connected to the first bridge portion by means of a first adaption via hole, and a second end of the first bridge connection portion is electrically connected to the second signal lead-in portion by means of a second adaption via hole; and
a second bridge connection portion, wherein the second bridge connection portion and the first bridge connection portion are located at a same layer, a first end of the second bridge connection portion is electrically connected to the second bridge portion by means of a third adaption via hole, and a second end of the second bridge connection portion is electrically connected to a signal lead-in line in the second line set by means of a fourth adaption via hole.

4. The display panel according to claim 3, wherein the third bridge portion comprises a plurality of third bridge sub-portions mutually arranged at intervals, and one third bridge sub-portion corresponds to one signal lead-in line; and the second bridge portion comprises a plurality of second bridge sub-portion, and one second bridge sub-portion corresponds to one signal lead-in line.

5. The display panel according to claim 4, wherein the plurality of second bridge sub-portions are mutually arranged at intervals; or
the plurality of second bridge sub-portions make contact with one another to form an integral structure;
wherein the second bridge connection portion comprises a plurality of second bridge connection sub-portions mutually arranged at intervals, and one second bridge sub-portion is electrically connected to one second bridge connection sub-portion by means of the third adaption via hole.

6. The display panel according to claim 3, wherein the first signal lead-in portion comprises at least one first signal lead-in sub-portion and a third signal lead-in sub-portion, and the third signal lead-in sub-portion is electrically connected to the first end of the first line set directly; and
the display panel further comprises:
a fifth bridge connection portion, wherein the fifth bridge connection portion and the first bridge connection portion are located at a same layer, the fifth bridge connection portion is electrically connected to each first signal lead-in sub-portion by means of a ninth adaption via hole, and the fifth bridge connection portion is electrically connected to the third signal lead-in sub-portion by means of a tenth adaption via hole.

7. The display panel according to claim 6, wherein a signal lead-in line in the first line set comprises a first signal lead segment and at least one second signal lead segment; and
the display panel further comprises:
a plurality of fourth bridge connection portions, wherein the fourth bridge connection portions and the first bridge connection portion are located at a same layer; and in one signal lead-in line, the first signal lead segment and the second signal lead segment are electrically connected by means of a corresponding fourth bridge connection portion, and adjacent second signal lead segments are electrically connected by means of a corresponding fourth bridge connection portion.

8. The display panel according to claim 7, wherein a first end of the first signal lead segment is electrically connected to the third signal lead-in sub-portion directly, a second end of the first signal lead segment is electrically connected to a first end of a corresponding fourth bridge connection portion by means of a fifth adaption via hole, and a second end of the fourth bridge connection portion is electrically connected to the second signal lead segment by means of a sixth adaption via hole; and
one of the adjacent second signal lead segments is electrically connected to a first end of a corresponding fourth bridge connection portion by means of a seventh adaption via hole, and a second end of the fourth bridge connection portion is electrically connected to an other second signal lead segment by means of an eighth adaption via hole.

9. The display panel according to claim 8, wherein second ends of the first signal lead segments in the first line set are mutually arranged at intervals; or, second ends of the first signal lead segments in the first line set make contact with one another to form an integral structure;
wherein a signal lead-in line in the second line set comprises at least two third signal lead segments; and the display panel further comprises: a plurality of third bridge connection portions, wherein in one signal lead-in line, two adjacent third signal lead segments are electrically connected by means of a corresponding third bridge connection portion, a first end of the third bridge connection portion is electrically connected to one third signal lead segment by means of a thirteenth adaption via hole, and a second end of the third bridge connection portion is electrically connected to an other third signal lead segment by means of a fourteenth adaption via hole.

10. The display panel according to claim 7, wherein the plurality of fourth bridge connection portions are mutually arranged at intervals;
wherein a total quantity of fourth bridge connection portions corresponding to one signal lead-in line in the first line set is equal to a sum of a total quantity of third bridge connection portions and second bridge connection portions corresponding to one signal lead-in line in the second line set.

11. The display panel according to claim 6, wherein the second signal lead-in portion comprises at least one second signal lead-in sub-portion; the first bridge connection portion is electrically connected to the second signal lead-in sub-portion by means of the second adaption via hole; and
a total quantity of first signal lead-in sub-portions is equal to a total quantity of second signal lead-in sub-portions.

12. The display panel according to claim 6, further comprising: a first auxiliary portion and a second auxiliary portion, wherein the first auxiliary portion, the second auxiliary portion and the bridge portions are located at a same layer;
an orthographic projection of the first auxiliary portion on the base substrate is located between orthographic projections of the first signal lead-in sub-portion and the third signal lead-in sub-portion on the base substrate, and the fifth bridge connection portion is electrically connected to the first auxiliary portion by means of a fifteenth adaption via hole; and
an orthographic projection of the second auxiliary portion on the base substrate is located between orthographic projections of the second signal lead-in sub-portion and the first bridge portion on the base substrate, and the first bridge connection portion is electrically connected to the second auxiliary portion by means of a sixteenth adaption via hole.

13. The display panel according to claim 12, further comprising: a plurality of third auxiliary portions, wherein the third auxiliary portions, the first auxiliary portion and the bridge portion are located at a same layer;
one signal lead-in line in the first line set is correspondingly provided with at least one third auxiliary portion; and
in one signal lead-in line, a first signal lead segment is electrically connected to a second signal lead segment by means of a corresponding third auxiliary portion;
wherein the display panel further comprises: a plurality of sixth bridge adaption portions and a plurality of seventh bridge adaption portions, wherein
at least one third auxiliary portion is correspondingly provided with at least one sixth bridge adaption portion and at least one seventh bridge adaption portion; and
a first end of the third auxiliary portion is electrically connected to a corresponding sixth bridge adaption portion by means of an eleventh adaption via hole, the sixth bridge adaption portion is electrically connected to a corresponding first signal lead segment by means of a twelfth adaption via hole, a second end of the third auxiliary portion is electrically connected to a corresponding seventh bridge adaption portion by means of a seventeenth adaption via hole, and the seventh bridge adaption portion is electrically connected to the corresponding second signal lead segment by means of an eighteenth adaption via hole.

14. The display panel according to claim 2, wherein the bridge portions comprise a fourth bridge portion, a sixth bridge portion, and a fifth bridge portion connected between the fourth bridge portion and the sixth bridge portion;
the fourth bridge portion is electrically connected to the second signal lead-in portion by means of a first conduction via hole; and
the sixth bridge portion is electrically connected to the signal lead-in line in the second line set by means of a second conduction via hole.

15. The display panel according to claim 14, wherein the fifth bridge portion comprises a plurality of fifth bridge sub-portions mutually arranged at intervals, the sixth bridge portion comprises a plurality of sixth bridge sub-portions mutually arranged at intervals, and
the fourth bridge portion is electrically connected to one signal lead-in line in the second line set by means of at least one fifth bridge sub-portion and at least one sixth bridge sub-portion.

16. The display panel according to claim 14, wherein the first signal lead-in portion comprises a first hollow area,
the first hollow area comprises a first bonding via hole, and the first bonding via hole penetrates the first signal lead-in portion;
wherein the first hollow area further comprises a first bonding slit, and the first bonding slit penetrates the first signal lead-in portion.

17. The display panel according to claim 16, further comprising: a fourth auxiliary portion and a fifth auxiliary portion, wherein the fourth auxiliary portion, the fifth auxiliary portion and the bridge portions are located at a same layer;
the fourth auxiliary portion is electrically connected to the first signal lead-in portion by means of a third conduction via hole; and
the fifth auxiliary portion is electrically connected to the second signal lead-in portion by means of a fourth conduction via hole.

18. The display panel according to claim 16, wherein the signal lead-in line in the first line set comprises a second hollow area,
the second hollow area comprises a second bonding via hole, and the second bonding via hole penetrates the signal lead-in line in the first line set;
wherein the second hollow area further comprises a second bonding slit, and the second bonding slit penetrates the signal lead-in line in the first line set;
wherein the second hollow area further comprises a second bonding via hole, the second bonding via hole penetrates the signal lead-in line in the first line set, and the second bonding via hole is located at one side, away from the first bonding via hole, of the second bonding slit; and
one end, connected to the fifth bridge sub-portion, of the second signal lead-in line in the second line set is provided with a fourth bonding via hole, and the fourth bonding via hole is located at one side, away from the sixth bridge sub-portion, of the second conduction via hole.

19. A display device, comprising a display panel, wherein the display panel comprises:
- a base substrate comprising a non-display area;
- a gate drive circuit located in the non-display area, wherein the gate drive circuit comprises a plurality of shift registers, and the plurality of shift registers are divided into a plurality of register sets;
- a plurality of signal lead-in lines located in the non-display area, wherein the plurality of signal lead-in lines are divided into a plurality of line sets, and a frame start signal end of one register set is correspondingly and electrically connected to one line set; and
- wherein a signal lead-in line of another line set is arranged between two signal lead-in lines of one line set;
- a plurality of signal lead-in portions, wherein one of the plurality of line sets is electrically connected to one of the plurality of signal lead-in portions; and
- a plurality of bridge portions, wherein the bridge portions and the signal lead-in portions are located at different layers;
- wherein the signal lead-in portions and the signal lead-in lines are located at a same layer; and one of the plurality of line sets is electrically connected to a corresponding signal lead-in portion directly, and the remaining line sets are electrically connected to corresponding signal lead-in portions by means of the bridge portions.

\* \* \* \* \*